(12) United States Patent
Tanaka et al.

(10) Patent No.: US 8,557,509 B2
(45) Date of Patent: Oct. 15, 2013

(54) NEGATIVE RESIST COMPOSITION, PATTERNING PROCESS, AND TESTING PROCESS AND PREPARATION PROCESS OF NEGATIVE RESIST COMPOSITION

(75) Inventors: Akinobu Tanaka, Jyoetsu (JP); Keiichi Masunaga, Jyoetsu (JP); Daisuke Domon, Jyoetsu (JP); Satoshi Watanabe, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 365 days.

(21) Appl. No.: 12/662,435

(22) Filed: Apr. 16, 2010

(65) Prior Publication Data

US 2010/0291484 A1    Nov. 18, 2010

(30) Foreign Application Priority Data

May 18, 2009    (JP) ................................. 2009-119854

(51) Int. Cl.
G03F 7/004    (2006.01)
G03F 7/028    (2006.01)
G03F 7/26    (2006.01)

(52) U.S. Cl.
USPC .................. 430/325; 430/270.1; 430/927

(58) Field of Classification Search
USPC ................. 430/270.1, 325, 434, 927
See application file for complete search history.

(56) References Cited

U.S. PATENT DOCUMENTS

| 6,902,862 | B2 | 6/2005 | Takahashi et al. | |
|---|---|---|---|---|
| 8,168,367 | B2 * | 5/2012 | Watanabe et al. | 430/270.1 |
| 2003/0022095 | A1 | 1/2003 | Kai et al. | |
| 2006/0166133 | A1 | 7/2006 | Koitabashi et al. | |
| 2006/0204891 | A1 | 9/2006 | Hatakeyama | |
| 2006/0281023 | A1 | 12/2006 | Hirosaki et al. | |
| 2007/0212619 | A1 | 9/2007 | Yoshikawa et al. | |
| 2008/0020290 | A1 | 1/2008 | Hatakeyama et al. | |
| 2008/0079169 | A1 * | 4/2008 | Maekawa | 257/773 |
| 2008/0241751 | A1 | 10/2008 | Takeda et al. | |
| 2010/0009299 | A1 | 1/2010 | Watanabe et al. | |
| 2010/0239980 | A1 | 9/2010 | Okuyama et al. | |
| 2010/0304301 | A1 * | 12/2010 | Tanaka et al. | 430/285.1 |
| 2011/0129765 | A1 * | 6/2011 | Tanaka et al. | 430/5 |
| 2011/0143266 | A1 * | 6/2011 | Tanaka et al. | 430/5 |
| 2011/0171579 | A1 * | 7/2011 | Domon et al. | 430/285.1 |
| 2011/0177464 | A1 | 7/2011 | Takeda et al. | |

FOREIGN PATENT DOCUMENTS

| CN | 1788239 A | 6/2006 |
|---|---|---|
| CN | 1825206 A | 8/2006 |
| CN | 101387831 A | 3/2009 |
| EP | 1 684 118 A1 | 7/2006 |
| EP | 1 975 711 A1 | 10/2008 |
| EP | 2 146 245 A2 | 1/2010 |
| EP | 2 253 996 A1 | 11/2010 |
| GB | 2 415 790 A | 1/2006 |
| JP | A-2002-244297 | 8/2002 |
| JP | A-2004-149756 | 5/2004 |
| JP | A-2005-004224 | 1/2005 |
| JP | A-2006-169302 | 6/2006 |
| JP | A-2006-201532 | 8/2006 |
| JP | A-2006-215180 | 8/2006 |
| JP | A-2007-241060 | 9/2007 |
| JP | A-2008-096684 | 4/2008 |
| JP | A-2008-249762 | 10/2008 |
| JP | A-2008-249951 | 10/2008 |
| WO | WO 2009/060869 A1 | 5/2009 |

OTHER PUBLICATIONS

European Search Report issued in Application No. 10 00 4363.7; Dated Sep. 1, 2010.
Jun. 27, 2012 Office Action issued in U.S. Appl. No. 12/902,868.
Apr. 5, 2011 European Search Report issued in European Application No. 10015092.9.
Jul. 24, 2012 Notification of Reasons for Refusal issued in Japanese Application No. 2009-119854 with English-language translation.
Nov. 16, 2012 Office Action issued in U.S. Appl. No. 12/902,868.
Jan. 14, 2013 Office Action issued in Chinese Patent Application No. 2010101781683 (with translation).
Mar. 19, 2013 Notification of Reasons for Refusal issued in Japanese Patent Application No. 2009-119854 (with partial translation).

* cited by examiner

*Primary Examiner* — Anca Eoff
(74) *Attorney, Agent, or Firm* — Oliff & Berridge, PLC

(57) ABSTRACT

There is disclosed a negative resist composition comprising at least (A) a base resin that is alkaline-soluble and is made alkaline-insoluble by action of an acid, and/or a combination of a base resin that is alkaline-soluble and is made alkaline-insoluble by reaction with a crosslinker by action of an acid, with a crosslinker, (B) an acid generator, and (C) a compound containing a nitrogen as a basic component, and forming a resist film having the film thickness X (nm) of 50 to 100 nm, wherein, in the case that the resist film is formed from the negative resist composition under the film-forming conditions for the pattern formation, a dissolution rate of the resist film into the alkaline developer used in the development treatment for the pattern formation is 0.0333X−1.0 (nm/second) or more and 0.0667X−1.6 (nm/second) or less. There can be a negative resist composition having excellent etching resistance and resolution and giving a good pattern profile even at the substrate's interface, a patterning process using the same, and a testing process and a preparation process of this negative resist composition.

11 Claims, 1 Drawing Sheet

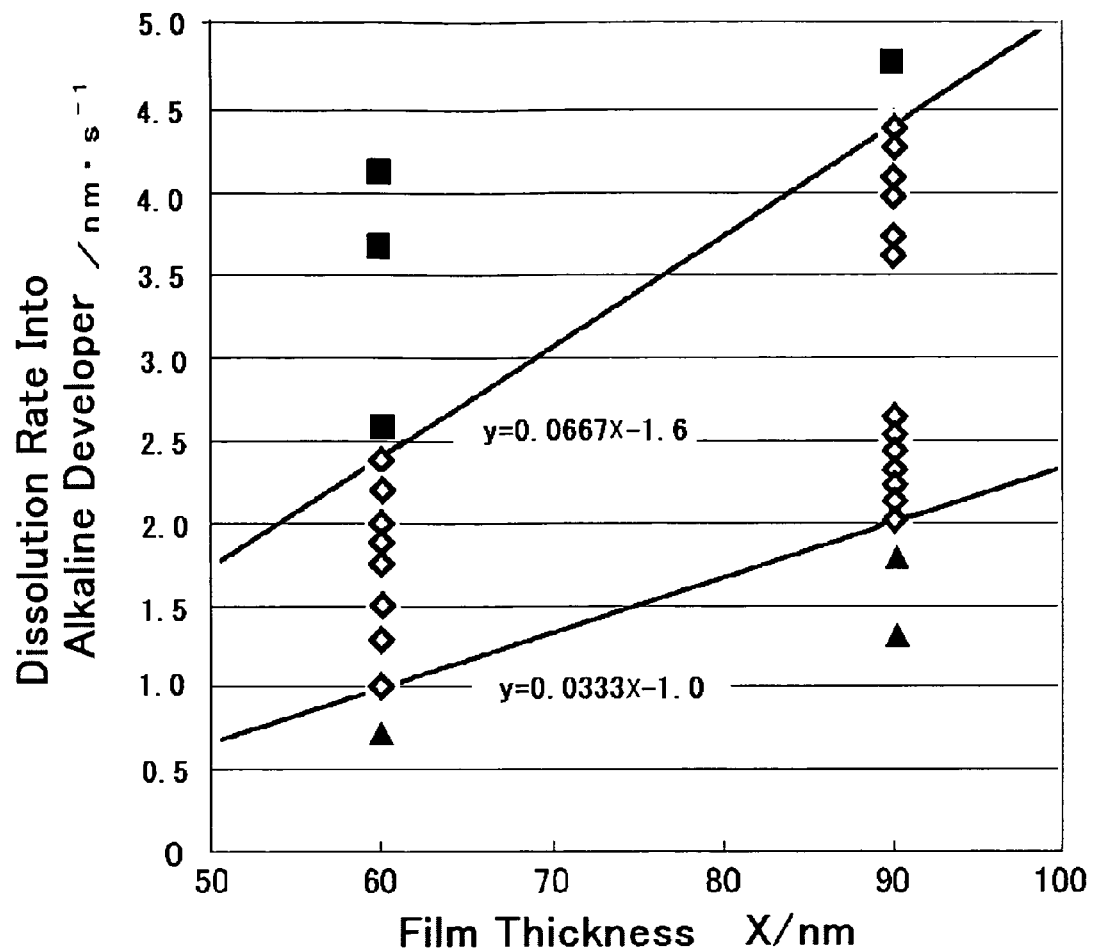

NEGATIVE RESIST COMPOSITION, PATTERNING PROCESS, AND TESTING PROCESS AND PREPARATION PROCESS OF NEGATIVE RESIST COMPOSITION

BACKGROUND OF THE INVENTION

1. Field of the Invention

The present invention relates to a negative resist composition, a patterning process, and a testing process and a preparation process of the negative resist composition.

2. Description of the Related Art

It is well known that, as LSI progresses toward a high integration and a further acceleration in speed, miniaturization of a pattern rule is required. With this move, an exposure method and a resist composition are changing significantly; especially when a lithography of the pattern with 0.2 μm or less is performed, the light sources such as an excimer laser of KrF and ArF, an electron beam, and the like are used, while a chemically amplified type having a good sensitivity to such high energy beams and giving a high resolution is used for a photo resist.

In a resist composition, there are a positive type in which an exposed part is dissolved and a negative type in which an exposed part remains as a pattern. They are selected based on the ease of its use and depending on the required resist pattern. A chemically amplified negative resist composition usually contains a polymer soluble in an aqueous alkaline developer, an acid generator generating an acid by decomposition with an exposure light, a crosslinker that insolubilizes the polymer into a developer by crosslinking the polymers among themselves by action of the acid as a catalyst (in a certain case a polymer and a crosslinker are integrated together), and, in addition, usually a basic compound to control diffusion of the acid generated by the light exposure.

Many negative resist compositions using the unit having a phenolic hydroxyl group as the alkaline-soluble unit in a polymer that is soluble in the aqueous alkaline developer have been developed, especially for exposure to a KrF excimer laser beam. These have not been used for an ArF excimer laser beam because the phenolic unit does not transmit the light when the exposure light having the wavelength of 150 to 220 nm is used. However, in recent years, these have been drawing attention again as the negative resist composition for exposure to EB and EUV, which are exposure methods to obtain a further finer pattern, as reported in Japanese Patent Laid-Open (kokai) No. 2006-201532, Japanese Patent Laid-Open (kokai) No. 2006-215180, and Japanese Patent Laid-Open (kokai) No. 2008-249762.

In order to perform fine processing as required in the EB and the EUV exposures as mentioned above, the resist film inevitably needs to be made thinner. This is because it is impossible to avoid the problem such as pattern delamination during development when the ratio of the pattern height to the pattern line width, the so-called aspect ratio, is too large. On the other hand, when the resist film is made thin, there appears the problem whether or not a satisfactory etching selectivity can be obtained at the time of transformation of the resist pattern to the film to be processed by using the resist pattern obtained from the said resist film. To address this etching resistance problem, a multi-layer resist method, in the case of processing of a semiconductor device (for example, Japanese Patent Laid-Open (kokai) No. 2008-96684) and an etching mask film method, in the case of processing of a photomask (for example, Japanese Patent Laid-Open (kokai) No. 2007-241060), have been proposed. As a result, a method, with which the etching contrast can be obtained even when a thin resist film like the one having the film thickness of 100 nm or less is used, is becoming available.

In the lithography by a resist film having the thickness of 100 nm or less as mentioned above, a part of the problem in etching resistance has been solved by the use of an etching auxiliary film and the like. However, it became clear that the requirement cannot be necessarily satisfied by the method in which the resist film is merely made thinner in order to obtain both of the etching resistance of the resist film to be used and the high resolution simultaneously.

SUMMARY OF THE INVENTION

In addition to the problems as mentioned above, another problem became newly appeared by the investigation of the present inventors; when a resist composition conventionally used as the chemically amplified negative resist with a high resolution is used with only increasing a solvent amount without changing solid components in order to use for a thin film, thereby attempting to form a fine pattern by using the film having the film thickness of 100 nm or less, the undercut is formed easily at the interface between a resist pattern and a substrate, leading to the failure of forming a fine pattern. Especially when the pattern formation is done by using the chemically amplified negative resist on chromium oxynitride, the outermost surface material of a photomask blank, at the time of processing of the photomask blank, a so-called undercut (a cleavage formed at the contact part of the resist pattern with the substrate) is formed, showing that the problems could not be fully solved by a conventional material. Accordingly, when the film thickness of the resist film is made 100 nm or less by using a conventional material especially in order to form a fine pattern, the pattern is prone to be collapsed easily by development, showing that a fine pattern has been difficult to be formed.

The present invention was made in view of the circumstances as mentioned above, and has an object to provide, in a photolithography for fine processing using the resist film of 50 to 100 nm thickness, especially in the lithography using an exposure light source such as a KrF laser, an extreme ultraviolet beam, an electron beam, and an X-ray beam, a negative resist composition having an excellent resolution and giving a good pattern profile even at the substrate's interface, a patterning process using the same, and a testing process and a preparation process of this negative resist composition.

In order to solve the above problems, the present invention provides a negative resist composition comprising at least (A) a base resin that is alkaline-soluble and is made alkaline-insoluble by action of an acid, and/or a combination of a base resin that is alkaline-soluble and is made alkaline-insoluble by reaction with a crosslinker by action of an acid, with a crosslinker, (B) an acid generator, and (C) a compound containing a nitrogen as an basic component, and forming a resist film having the film thickness X (nm) of 50 to 100 nm for an exposure treatment and a development treatment by an alkaline developer to form a resist pattern, wherein, in the case that the resist film is formed from the negative resist composition under the film-forming conditions for the pattern formation, a dissolution rate of the resist film into the alkaline developer used in the development treatment for the pattern formation is $0.0333X-1.0$ (nm/second) or more and $0.0667X-1.6$ (nm/second) or less.

When the negative resist composition as mentioned above is used, formation of the undercut can be avoided and a pattern with a high resolution can be obtained stably even on the substrate whose surface is composed of a material like a chromic material, which easily causes such problems as the pattern collapse, the undercut formation at the time of formation of a negative resist pattern, and the like.

Here, the film-forming conditions for the pattern formation, such as time and temperature that can be used for the film formation, are independently determined for respective compositions as the values having ranges depending on the components in the composition and combinations thereof, because, in a resist film of a chemically amplifying type, the state of a resist film matrix, especially the amount of the remaining solvent and the state of the resin packing, changes with the conditions of the film formation. Outside this allowable range, desirable values of resolution and of pattern profile cannot be obtained, and thus the film-forming conditions for the pattern formation here mean the conditions for a resist composition to give a film having intended resolution and pattern profile.

The alkaline developer used in the development treatment for the pattern formation means to use the developer whose factors giving strong effects on the base resin's alkaline-solubility characteristics are the same as those in the developer actually used while concentration and the like of the alkaline component is changed as the case may be, and does not mean to judge whether it is the developer or not for the pattern formation by the difference, for example, whether it contains a surfactant or not.

It is preferable that the foregoing base resin contains a phenolic hydroxyl group as the alkaline-soluble group and 95% or more by mol of the repeating units constituting the base resin include a monomer structure having an aromatic skeleton.

When the base resin having a monomer structure like this is used, a high etching resistance can be obtained.

More specifically, it is preferable that 95% or more by mol of the repeating units that constitute the foregoing base resin be any combination of the repeating units represented by the following general formulae (1) to (3):

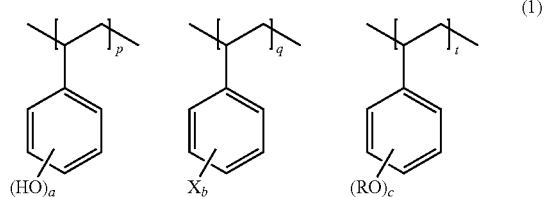

(1)

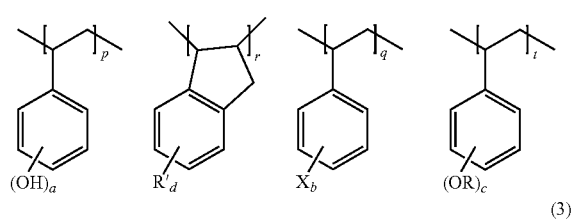

(2)

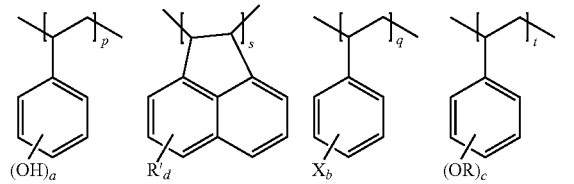

(3)

wherein, X represents a chlorine atom, a bromine atom, an iodine atom, a carbonyl group, a nitro group, a cyano group, a sulfinyl group, or a sulfonyl group. R represents a linear, a branched, or a cyclic alkyl or oxoalkyl group having 2 to 10 carbon atoms, or a substituted or an unsubstituted benzoyl or naphthoyl group. R' represents a hydrogen atom, or a linear, a branched, or a cyclic alkyl or oxoalkyl group having 2 to 10 carbon atoms, or a substituted or an unsubstituted benzoyl or naphthoyl group. p, q, r, and s represent a positive integer, and t represents 0 or a positive integer. a and b represent 1 or 2, c represents an integer of 0 to 3, and d represents 0 to 2.

When a base resin selected from these combinations of repeating units is used, a negative resist composition having suitable resolution and etching resistance can be obtained.

It is preferable that the acid generator of the component (B) contains at least one or more kinds of the compounds represented by the following general formula (4):

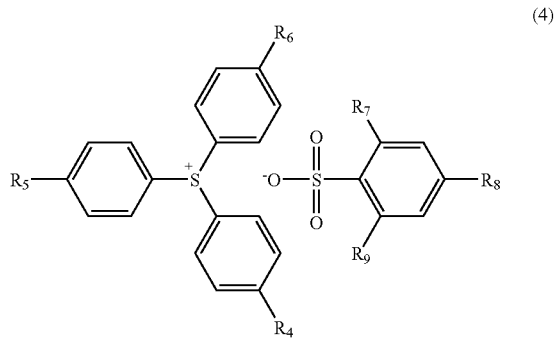

(4)

wherein, $R_4$, $R_5$, and $R_6$ represent a hydrogen atom, or a linear, a branched, or a cyclic alkyl or alkyloxy group having 4 to 10 carbon atoms, wherein all of them cannot be a hydrogen atom. $R_7$, $R_8$, and $R_9$ represent a hydrogen atom, a methyl group, an ethyl group, or an isopropyl group, wherein they may be the same or different.

The acid generator represented by the general formula (4) has a high anti-dissolution effect into an alkaline developer, and thus by using this component the dissolution rate of a resist film into the alkaline developer can be controlled easily.

It is preferable that the basic component of the component (C) contains one or more kinds of amine compounds or amine oxide compounds at least having a carboxyl group and not having a hydrogen atom covalently bonded to a base-center nitrogen atom.

As mentioned above, when an amine compound or an amine oxide compound at least having a carboxyl group and not having a hydrogen atom covalently bonded to a base-center nitrogen atom is used as the basic component of the component (C), formation of the undercut can be avoided more effectively.

Specific examples of the amine compound or amine oxide compound having a carboxyl group and not having a hydrogen atom covalently bonded to a base-center nitrogen atom include the compounds represented by the following general formulae (5) to (7):

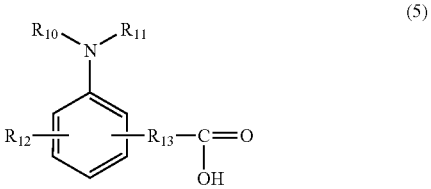

(5)

wherein, $R_{10}$ and $R_{11}$ each represents a linear, a branched, or a cyclic alkyl group having 1 to 20 carbon atoms, an aryl group having 6-20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms. $R_{10}$ and $R_{11}$ may be bonded to form a cyclic structure. $R_{12}$ represents a hydrogen atom, or a linear, a branched, or a cyclic alkyl group having 1 to 20 carbon atoms, an, aryl group having 6-20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, an alkyl thioalkyl group having 1 to 10 carbon atoms, or a halogen group. $R_{13}$ represents a linear, a branched, or a cyclic alkylene group having 0 to 20 carbon atoms, or an arylene group having 6 to 20 carbon atoms;

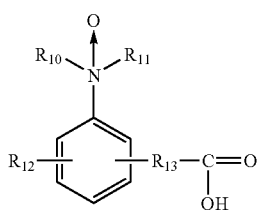

(6)

wherein, $R_{10}$, $R_{11}$, $R_{12}$, and $R_{13}$ represent the same meaning as before;

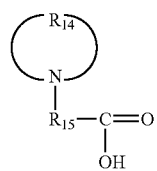

(7)

wherein, $R_{14}$ represents a linear or a branched alkylene group, substituted or unsubstituted, having 2 to 20 carbon atoms which may contain one or a plurality of a carbonyl group, an ether group, an ester group, and a sulfide between the carbon-carbon bond of the alkylene group. $R_{15}$ represents a linear, a branched, or a cyclic alkylene group having 1 to 20 carbon atoms, or an arylene group having 6 to 20 carbon atoms.

Further, the basic component of the component (C) may contain, in addition to the foregoing, at least one or more kinds selected from amine compounds and amine oxide compounds represented by the following general formulae (8) and (9):

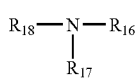

(8)

wherein, $R_{16}$, $R_{17}$, and $R_{18}$ each represents a hydrogen atom, or a linear, a branched, or a cyclic alkyl group having 1 to 20 carbon atoms, an aryl group having 6-20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms. Two of $R_{16}$, $R_{17}$, and $R_{18}$ may be bonded to form a cyclic structure or an aromatic ring;

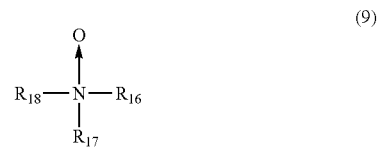

(9)

wherein, $R_{16}$, $R_{17}$, and $R_{18}$ represent the same meaning as before.

As mentioned above, the amine compound or the amine oxide compound having a carboxyl group and not having a hydrogen atom covalently bonded to a base-center nitrogen atom may be combined with one or more kinds of the amine compounds or the amine oxide compounds represented by the foregoing general formula (8) or (9).

Further, the present invention provides a resist patterning process, the resist patterning process by a lithography, wherein, at least, a resist film having the film thickness of 50 to 100 nm is formed on a substrate to be processed by using the negative resist composition, and the resist film is exposed to a high energy beam and then developed by an alkaline developer to obtain a resist pattern.

By using the resist patterning process of the present invention as mentioned above, formation of the undercut is suppressed, so that a resist pattern having a high resolution and a desirable profile can be obtained even when the pattern having the minimum line width of 50 nm or less is formed by using a thin resist film like the one having the film thickness of 50 to 100 nm.

As the substrate to be processed, a photomask blank can be used.

In the photomask blank processing, in order to form a mask pattern profile applied with an OPC (Optical Proximity Effect Correction) or the like, not only formation of the pattern having a fine line width but also, because it becomes an original plate at the time of performing a lithography, no defects such as causing more delamination than the pattern formation at the time of preparation of a semiconductor device are required. Accordingly, the resist patterning process of the present invention, in which delamination or the like caused by the undercut is suppressed, can be suitably used.

The resist patterning process of the present invention is effectively used also in the case that a chromium compound film is formed on the outermost surface of the photomask blank.

In the pattern formation on the chromium compound film, the undercut is formed even more easily than the compounds such as titanium nitride and silicon nitride, which are prone to form the undercut easily. By using the resist patterning process of the present invention, the undercut formation can be avoided even in the case of the pattern formation on the chromium compound film as mentioned above.

The present invention further provides a testing process of a negative resist composition, the testing process of a negative resist composition comprising at least (A) a base resin that is alkaline-soluble and is made alkaline-insoluble by action of an acid, and/or a combination of a base resin that is alkaline-soluble and is made alkaline-insoluble by reaction with a crosslinker by action of an acid, with a crosslinker, (B) an acid generator, and (C) a compound containing a nitrogen as a basic component, and forming a resist film having the film thickness X (nm) of 50 to 100 nm for an exposure treatment and a development treatment by an alkaline developer to form a resist pattern, wherein the negative resist composition is judged to be acceptable when a dissolution rate of the resist film is 0.0333X−1.0 (nm/second) or more and 0.0667X−1.6 (nm/second) or less wherein the resist film is formed from the negative resist composition under the film-forming conditions for the pattern formation and then the dissolution rate is measured by using the alkaline developer.

Use of the testing process of the present invention as mentioned above warrants that formation of the undercut does not occur easily when the pattern formation is done by using the resist film-forming composition that has passed the test; thus the resist pattern with a high resolution and with a desirable profile can be obtained.

The present invention further provides a preparation process of a negative resist composition comprising at least
(A) a base resin that is alkaline-soluble and is made alkaline-insoluble by action of an acid, and/or a combination of a base resin that is alkaline-soluble and is made alkaline-insoluble by reaction with a crosslinker by action of an acid, with a crosslinker,
(B) an acid generator, and
(C) a compound containing a nitrogen as a basic component, and forming a resist film having the film thickness X (nm) of 50 to 100 nm for an exposure treatment and a development treatment by an alkaline developer to form a resist pattern, wherein each component is selected so that a dissolution rate of the resist film formed from the negative resist composition into the alkaline developer is 0.0333X−1.0 (nm/second) or more and 0.0667X−1.6 (nm/second) or less.

When the negative resist composition obtained by the preparation process of the negative resist composition in the way as mentioned above is pattern-exposed and developed according to the prescribed process after it has been made to a resist film having an intended film thickness, a resist pattern having a high resolution and with suppressed undercut formation can be obtained.

Preparation of the foregoing components can be done by selecting the kinds and the mixing ratio of two or more of the base resins having different dissolution rates into the alkaline developer.

As mentioned above, not only selection of the base resins and the acid generators but also control of the dissolution rate by combination of base resins having different dissolution rates into the alkaline developer are effective preparation processes of the resist composition of the present invention.

By using the negative resist composition of the present invention, a high resolution that had been difficult to be realized because of the undercut formation when the film thickness of the resist film was made 50 to 100 nm can be improved significantly while satisfying the required performance such as the etching resistance and the pattern profile.

BRIEF DESCRIPTION OF THE DRAWINGS

FIG. 1 shows the evaluation results of the resist pattern wherein the film thickness X of the resist film is shown in the horizontal axis and the dissolution rate of the resist film into the alkaline developer is shown in the vertical axis.

DETAILED DESCRIPTION OF THE PREFERRED EMBODIMENTS

Hereinafter, the present invention will be described more specifically.

A negative resist resin of a chemically amplified type using a base resin having a hydroxystyrene unit as the unit that gives a dissolvability into an aqueous alkaline developer while is made undissolvable in the developer by the reaction with an acid for crosslinking has been used as the resist resin for the exposure to an electron beam and an extreme ultraviolet beam even after the most advanced lithography method by an ultraviolet beam was shifted to ArF. For example, as reported in the Japanese Patent Laid-Open (kokai) No. 2008-249762, a fine pattern such as the one having an excellent form with 80 nm could be formed successfully by the pattern exposure of the resist film having the film thickness of 240 nm by an electron beam.

Inventors of the present invention formed a thin resist film like the one having the film thickness of 100 nm or less only by changing the amount of the solvent in the chemically amplified resist composition that realized a high resolution with the film thickness of more than 100 nm as mentioned above, and then attempted to form a pattern having a minimum line width of 50 nm or less. As a result of the investigation, however, it was found that fine patterns collapsed, resulting in causing the problem that a high resolution could not be realized.

In a conventional resist film rendered with a high resolution in the case of its film thickness being more than 100 nm as mentioned above, its dissolution rate into the alkaline developer has been designed to be 6 nm/second or more in the past, because problems of defects such as the residual development are feared.

Inventors of the present invention assumed a working hypothesis that the pattern collapse in the case of the thickness of the resist film being made 100 nm or less is caused by this design of the dissolution rate.

Namely, in the case of the resist film thickness of 100 nm or less with this dissolution rate, development by a spray development is finished in 10 seconds or less, whereby the formed pattern is exposed thereafter to the alkaline developer until the end of the development. In addition, the crosslinking density in the part to be remained as the pattern is lowered near the substrate's interface where the acid concentration tends to be easily decreased by the acid diffusion; and thus the substrate's interface is prone to be easily eroded, increasing the undercut formation drastically. On the other hand, the development time cannot be made shorter than 60 seconds because of the defect problem; thus this does not provide a practical solution to the foregoing problem.

Accordingly, inventors of the present invention noted the relationship between the dissolution rate of the resist film into the alkaline developer and the undercut formation in the resist film having the film thickness of 100 nm or less, and then attempted to form the pattern by an electron beam exposure by using many samples.

From this investigation it became clear that the dissolution rate could be controlled by the dissolution rate of a base resin into the alkaline developer or by use of an acid generator having a high anti-dissolution effect.

As a result, it was found that the pattern having the line width of 50 nm without the undercut could be formed when the upper limit of the dissolution rate into the alkaline developer was made 4.4 nm/second or less in the case that the resist film having the film thickness of 90 nm was formed. It was also found that the pattern having the line width of 40 nm or less without the undercut could be formed when the dissolution rate into the alkaline developer was made 2.4 nm/second or less in the case that the resist film having the thickness of 60 nm was used. Accordingly, it was found that formation of the undercut at the time of the pattern formation from the negative resist film having the film thickness of 100 nm or less is dependent on the film thickness at the time of its use (at the time of the pattern formation).

Meanwhile, it was also found that the dissolution rate not giving the dissolution rate defect nor impairing the resolution was 2.0 nm/second or more when the resist film having the film thickness of 90 nm was used, and 1.0 nm/second or more when the resist film having the film thickness of 60 nm was used, showing the dependency on the film thickness in this case, too.

Although the relationship between the film thickness and the dissolution rate giving a good pattern as mentioned above cannot be expressed by a simplified model, the range giving a good pattern can be estimated correctly by approximation with a linear line within a certain small limited range, namely in the range of the film thickness between 50 nm and 100 nm.

As a result, the range of the dissolution rate giving a good pattern of the resist film having the film thickness X (nm) of 50 to 100 nm could be found as shown in FIG. 1. Namely, it was found that the negative resist composition having the dissolution rate in the range of the upper limit of 0.0667X−1.6 (nm/second) and the lower limit of 0.0333X−1.0 (nm/second) gives a high resolution and a good pattern when the thickness of the resist film is in the range between 50 nm and 100 nm.

Namely, inventors of the present invention found that a high resolution and a good pattern without the undercut formation can be obtained when the negative resist composition, comprising at least (A) a base resin that is alkaline-soluble and is made alkaline-insoluble by action of an acid, and/or a combination of a base resin that is alkaline-soluble and is made alkaline-insoluble by reaction with a crosslinker by action of an acid, with a crosslinker, (B) an acid generator, and (C) a compound containing a nitrogen as a basic component, and forming a resist film having the film thickness X (nm) of 50 to 100 nm for an exposure treatment and a development treatment by an alkaline developer to form a resist pattern, wherein, in the case that the resist film is formed from the negative resist composition under the film-forming conditions for the pattern formation, a dissolution rate of the resist film into the alkaline developer used in the development treatment for the pattern formation is 0.0333X−1.0 (nm/second) or more and 0.0667X−1.6 (nm/second) or less, is used.

The present invention is the result obtained from the physical properties of the resist film (dissolution rate) to the alkaline developer, and can be generally applicable to the chemically amplified negative resist composition containing at least the components (A) to (C) as the solid components, wherein especially preferable resist compositions may be exemplified by the following compositions.

Firstly, the component (A), a base resin that is alkaline-soluble and is made alkaline-insoluble by action of an acid, and/or a combination of a base resin that is alkaline-soluble and is made alkaline-insoluble by reaction with a crosslinker by action of an acid, with a crosslinker, will be explained.

As to the base resin of the component (A) of the present invention for the thin resist film having the film thickness X (nm) of 50 to 100 nm and requiring a high etching resistance in the present invention, a resin containing a repeating unit having an aromatic skeleton in a high composition ratio is useful. In particular, it is preferable that 95% or more by mol of the repeating units constituting the base resin include a monomer structure having an aromatic skeleton. A phenolic hydroxyl group is useful as the suitable alkaline-soluble group to obtain the dissolution rate of the present invention.

A preferable combination of the repeating units having the aromatic skeleton that constitute the base resin as mentioned above can be exemplified by a base resin containing repeating units mainly comprising, as shown in the following structural formulae (1) to (3), a hydroxystyrene unit and units of a styrene that is substituted with an electron-withdrawing group:

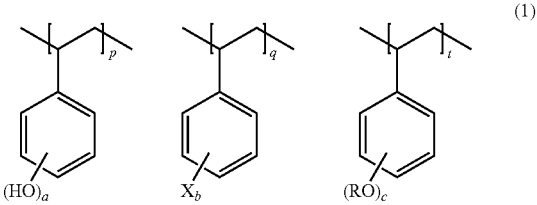

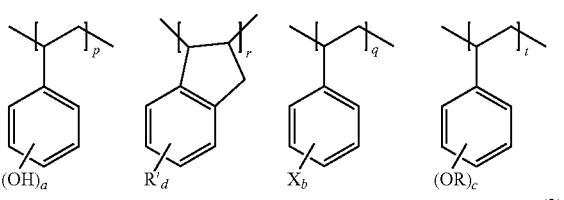

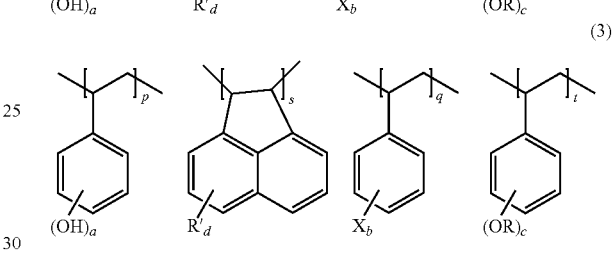

wherein, X represents a chlorine atom, a bromine atom, an iodine atom, a carbonyl group, a nitro group, a cyano group, a sulfinyl group, or a sulfonyl group. R represents a linear, a branched, or a cyclic alkyl or oxoalkyl group having 2 to 10 carbon atoms, or a substituted or a unsubstituted benzoyl or naphthoyl group. R' represents a hydrogen atom, or a linear, a branched, or a cyclic alkyl or oxoalkyl group having 2 to 10 carbon atoms, or a substituted or a unsubstituted benzoyl or naphthoyl group. p, q, r, and s represent a positive integer, and t represents 0 or a positive integer. a and b represent 1 or 2, c represents an integer of 0 to 3, and d represents an integer of 0 to 2.

The repeating unit has an ethylene moiety that constitutes a main chain by polymerization whereby each ethylene moiety is polymerized by a heretofore known radical polymerization method (for example, Japanese Patent Laid-Open (kokai) No. 2008-249762) and the like to obtain the resin. To obtain its copolymer, existence of a conjugated system with an ethylene moiety is necessary, and in order to have a high etching resistance a monomer whose ethylene moiety is directly bonded to an aromatic ring as the conjugated system is preferably used.

Many monomer skeletons like this can be used if the ethylene moiety and the aromatic ring form a direct bond, but a usually used styrene skeleton, an indene skeleton and an acenaphthylene skeleton in which the ethylene moiety further forms a ring, are especially useful because of good polymerization properties and giving a high resolution.

The dissolvability into an alkaline solution can be given by the acidic properties of a repeating unit having a phenolic hydroxyl group; the dissolution rate can be enhanced by the increase of this repeating unit. The one having the hydroxyl group at the 3-position is smaller in the enhancing effect of the dissolution rate as compared with the one having the hydroxyl group at the 4-position, and thus these can be selected according to the requirement.

It is assumed, though its mechanism is not clear, that introduction of a styrene unit having an electron-withdrawing group such as a chlorine atom, a bromine atom, an iodine atom, a carbonyl group, a nitro group, a cyano group, a sulfinyl group, and a sulfonyl group etc. can enhance the reactivity with a crosslinker, thereby giving a tendency to inhibit the swelling at the time of development.

The repeating unit having an aromatic ring not containing a phenolic hydroxyl group has a role to control the dissolution of the base resin into an alkaline developer, and at the same time enhances the rigidity of the resist, thereby inhibiting the swelling at the time of development and contributing to improvement in the resolution and the etching resistance. The repeating unit whose phenolic hydroxyl group is blocked by an alkyl group or an oxoalkyl group plays a role to control the dissolution into an alkaline developer. Blocking by an oxoalkyl group has a merit in that it can easily control the alkaline-dissolvability of the base resin, because the phenolic hydroxyl can be easily acylated by a reaction with an acyl chloride or an acid anhydride. Specific examples of them are disclosed, for example, in Japanese Patent Laid-Open (kokai) No. 2006-201532, Japanese Patent Laid-Open (kokai) No. 2006-215180, and Japanese Patent Laid-Open (kokai) No. 2008-249762.

Among the combinations of the monomer units represented by the general formulae (1) to (3), the ratios (mol ratio) of the monomer units in the general formula (1) are; preferably $0.5<p/(p+q+t)<0.95$ and more preferably $0.65<p/(p+q+t)<0.85$; preferably $0<q/(p+q+t)<0.4$ and more preferably $0.05<q/(p+q+t)<0.3$; and preferably $0\leq t/(p+q+t)<0.3$.

The ratios in the general formula (2) are; preferably $0.5<p/(p+q+r+t)<0.95$ and more preferably $0.65<p/(p+q+r+t)<0.85$; preferably $0<q/(p+q+r+t)<0.4$ and more preferably $0.05<q/(p+q+r+t)<0.3$; preferably $0<r/(p+q+r+t)<0.35$; and preferably $0\leq t/(p+q+r+t)<0.3$.

The ratios in the general formula (3) are; preferably $0.5<p/(p+q+s+t)<0.95$ and more preferably $0.65<p/(p+q+s+t)<0.85$; preferably $0<q/(p+q+s+t)<0.4$ and more preferably $0.05<q/(p+q+s+t)<0.3$; preferably $0<s/(p+q+s+t)<0.3$; and preferably $0\leq t(p+q+s+t)<0.3$.

When the ratio of p is less than 0.85, the alkaline-dissolution rate of an unexposed part is not too large, and thus there is no fear of the problem of the pattern formation after the development. When the ratio is more than 0.65, formation of a fine pattern is easy, and there is no fear of the problem of the residual development.

When the ratio of q is more than 0.05 and less than 0.3, there is no fear of poor resolution and of occurrence of defects after development.

Increase of the ratio of r or s decreases the alkaline-dissolvability and increases the etching resistance. When the ratio of r is less than 0.35 and the ratio of s is less than 0.3, there is no fear to decrease in the resolution and to cause defects.

In order to control the dissolution rate into the alkaline solution, t is used preferably in the range of 0 or more and less than 0.3.

By appropriately choosing the values of p, q, r, s, and t in the foregoing ranges, the resolution, the etching resistance, and the pattern profile can be arbitrarily controlled.

A base resin (A) in the negative resist composition of the present invention is preferably the one having the weight-average molecular weight of 1,000 to 50,000 (the measurement is done by a gel-permeation chromatography with the reference to the polystyrene standard with an instrument, HLC-8120GPC, manufactured by Tosoh Corp.).

When the weight-average molecular weight is in the range of 1,000 or more and 50,000 or less, the heat resistance of the resist composition is sufficient and the chances to decrease in the resolution and to cause defects in the resist pattern after the development are low.

When the molecular weight distribution (Mw/Mn) of a copolymer of the foregoing general formulae (1) to (3) in the base resin (A) of the negative resist composition of the present invention is narrow, there is a low risk to form a foreign spot or to deteriorate a pattern profile after exposure caused by existence of a low-molecular weight or a high-molecular weight polymer. The effects of the molecular weight and the molecular weigh distribution as mentioned above become large as the pattern rule progresses toward miniaturization; thus the molecular weight distribution of a multicomponent copolymer to be used is preferably in the range of 1.0 to 2.5, in particular as low as 1.0 to 1.8, in order to obtain the resist composition for the fine pattern size like the one of the present invention.

The dissolution rate of the foregoing base resin obtained by polymerization (the dissolution rate of the film into the developer wherein the film is obtained by using only the base resin as the solid component) is an important factor to determine the dissolution rate of the resist film formed from the negative resist composition prepared by using the said base resin. Accordingly, it is important to control the dissolution rate of the polymer by selecting the monomer composition as mentioned above; also a negative resist composition giving an intended dissolution rate can be prepared by selecting the kinds of base resins having different dissolution rates and mixing them by selecting an appropriate mixing ratio.

In the negative resist composition of the present invention, a crosslinker may be integrated into a base resin as appropriate by such a method that a repeating unit having an epoxy group is incorporated into a base resin. However, in general, a crosslinker as shown below is separately added in the negative resist composition of the present invention.

The crosslinker is the one that reacts with the base resin by an acid as a catalyst generated from an acid generator (this will be elaborated later) to form the bonds inside the base resin and among the base resins thereby making the resist film alkaline-insoluble. Generally, this is a compound having a plurality of functional groups that can form a bond by reacting electrophilically with an aromatic ring or a hydroxyl group contained in the constituting unit of the foregoing base resin; many compounds of this kind have already been known.

Basically, a crosslinker contained in the resist composition of the present invention may be any of crosslinkers already known, while alkoxy methyl glycolurils, alkoxy methyl melamines, and the like may be mentioned as the preferable crosslinkers. Specific examples of the alkoxy methyl glycolurils include tetramethoxy methyl glycoluril, 1,3-bis-methoxymethyl-4,5-bismethoxy ethylene urea, and bis-methoxy methyl urea. Specific examples of the alkoxy methyl melamines include hexamethoxy methyl melamine and hexaethoxy methyl melamine.

The amount of the crosslinker to be added in the chemically amplified negative resist composition of the present invention is preferably in the range of 2 to 40 parts by mass and more preferably in the range of 5 to 20 parts by mass, relative to 100 parts by mass of the solid component contained in the resist composition. The foregoing crosslinkers may be used singly or as a mixture of two or more kinds of them.

Basically, as to the acid generator of the component (B) contained in the negative resist composition of the present invention, those which are applicable to a chemically amplifying-type resist and in a public, can be used (for example, those disclosed in Japanese Patent Laid-Open (kokai) No. 2008-249762, and so on).

As the preferable acid generators, a sulfonium salt type, an iodonium salt type, a sulfonyl diazomethane, an N-sulfonyl oxyimide type, and the like can be mentioned; they may be used singly or as a mixture of two or more kinds of them. Examples of the suitable counter anion of the sulfonic acid generated from the foregoing salts or compounds include a benzene sulfonic acid anion, a toluene sulfonic acid anion, a 4-(4-toluenesulfonyloxy)benzene sulfonic acid anion, a pentafluorobenzene sulfonic acid anion, a 2,2,2-trifluoroethane sulfonic acid anion, a nonafluorobutane sulfonic acid anion, a heptadecafluorooctane sulfonic acid anion, and a camphor sulfonic acid anion, and the like.

The amount of the acid generator of the component (B) to be added in the negative resist composition of the present invention is not particularly limited, but preferably in the rage of 0.4 to 20 parts by mass, and more preferably in the range of 0.8 to 15 parts by mass, relative to 100 parts by mass of the base resin of the component (A).

By simultaneously increasing the adding amounts of the acid generator and the basic component (C) (the latter will be elaborated later), securement of sensitivity and improvement of resolution can be expected. Generally, when the amount of the component (B) is 20 or lower parts by mass, the sensitivity can be improved efficiently and thus there is no fear of diseconomy. When the amount is 0.4 or more parts by mass, there is no need to make the amount of the basic component low in order to satisfy the required sensitivity and thus there is no fear of decreasing the resolution of the resist pattern to be formed.

Especially in the case of making the resist film to be used for exposure to a radiation beam or an electron beam, a high sensitivity cannot be obtained easily although there is no problem of an energy attenuation of the radiating beam in the resist film due to the addition of the acid generator. Accordingly, concentration of the acid generator to be added is preferably made higher as compared with the case of using an excimer laser beam; thus the adding amount of the acid generator is preferably in the range of 0 to about 20 parts by mass.

Among the foregoing acid generators, when the acid generator represented by the following general formula (4) is used singly, or as a mixture of two or more kinds of the generators represented only by the general formula (4), or, as appropriate, in such a combination that its content in the acid generators to be added is, as a rough guide, 80% or more by mol, a suitable pattern having an especially high resolution can be obtained when combined with the foregoing component (A). A further suitable result of this can be obtained when the acid generator represented by the general formula (4) is used singly or as a mixture of two or more kinds of the acid generators represented only by the general formula (4):

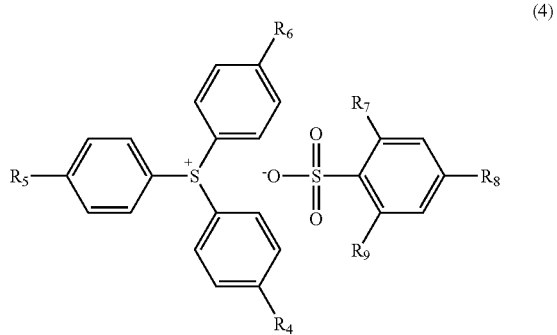

(4)

wherein, $R_4$, $R_5$, and $R_6$ represent a hydrogen atom, or a linear, a branched, or a cyclic alkyl or alkyloxy group having 4 to 10 carbon atoms, wherein all of them cannot be a hydrogen atom. $R_7$, $R_8$, and $R_9$ represent a hydrogen atom, a methyl group, an ethyl group, or an isopropyl group, wherein they may be the same or different.

The acid generator shown by the above general formula (4) has a high anti-dissolution effect, drastically decreasing the dissolution rate of the resist film into an alkaline developer. Accordingly, when used as a conventional negative resist composition, there has been a problem of such a defect as to cause the residual development easily, though it has a merit in that a pattern having a rectangular form can be formed. However, it was found that, in the case that the acid generator was used to form a resist film having the film thickness of 50 to 100 nm, such as the case of the present invention, a fine rectangular pattern could be formed without forming an undercut by appropriately controlling the dissolution rate of the resist film so that the defect might not be formed.

In the above general formula (4), those whose $R_4$, $R_5$, and $R_6$ are made to a tertiary alkoxy group also have a high anti-dissolution effect, but there is a problem of the decrease in the anti-dissolution effect caused by the change from the alkoxy group to the hydroxyl group after the light exposure and the development. Accordingly, it is more preferable that an alkyl group, or a primary or a secondary alkoxy group be selected for $R_4$, $R_5$, and $R_6$.

In controlling the dissolution rate of the resist film into an alkaline developer, when the acid generator shown by the general formula (4) is used in a combination with a base resin shown by the structural formulae (1) to (3), or in a mixture with other acid generator, the dissolution rate of the resist film into an alkaline developer can be easily controlled, whereby a fine rectangular pattern with no defects can be obtained.

A benzene sulfonic acid moiety, the counter anion of the general formula (4), can be adjusted appropriately between the objects to control the acid diffusion and the pattern profile by an alkyl group to be introduced into a benzene nucleus. The acid diffusion can be suppressed by the alkyl group in the descending order of an isopropyl group, an ethyl group, and a methyl group, whereby the resist sensitivity decreases simultaneously. Basically, as the acid diffusion is suppressed, the resolution tends to be increased, while the reactivity decreases in a certain case.

As to the nitrogen-containing compound of the basic component (C) of the present invention, by the same token as the acid generator as mentioned above, basically a heretofore known basic component usable in a chemically amplified resist can be used. Examples of them include, as disclosed in Japanese Patent Laid-Open (kokai) No. 2008-249762, primary, secondary, and tertiary aliphatic amines; mixed amines; aromatic amines; heterocyclic amines; a nitrogen-containing compound having a carboxy group; a nitrogen-containing compound having a sulfonyl group; a nitrogen-containing compound having a hydroxy group; a nitrogen-containing compound having a hydroxyphenyl group; a nitrogen-containing alcoholic compound; an amide derivative; and an imide derivative, and the like.

The basic component of the component (C) can be used singly or in a combination of two or more kinds; its amount in a mixture with a base resin of 100 parts by mass is preferably in the range of 0.01 to 2 parts by mass, in particular in the range of 0.01 to 1 part by mass. In the range of 0.01 to 2 parts by mass, the blending effect can be expressed with no fear of an excessive decrease in the sensitivity.

Among the basic components blended as the foregoing component (C), an amine compound or an amine oxide compound at least having a carboxyl group and not having a hydrogen atom covalently bonded to a base-center nitrogen atom is a particularly advantageous material; because, in the case that other basic component is used in a negative resist composition containing a base resin (component (A)) thereby forming an unreacted part (so-called undercut) at the pattern edge near the substrate, it can resolve the undercut.

Those substrates easily forming the undercut like this include substrates of nitride materials such as TiN, SiN, and SiON, while the undercut is extremely easily formed especially when the surface is made of a chromium metal or a film of a chromium compound containing a nitrogen and/or an oxygen; thus an extremely high effect in resolving the undercut problem can be expressed there.

Preferable specific chemical structure examples of the amine compound or an amine oxide compound at least having a carboxyl group and not having a hydrogen atom covalently bonded to a base-center nitrogen atom include the compounds represented by the following general formulae (5) to (7), but not limited to the examples as described below.

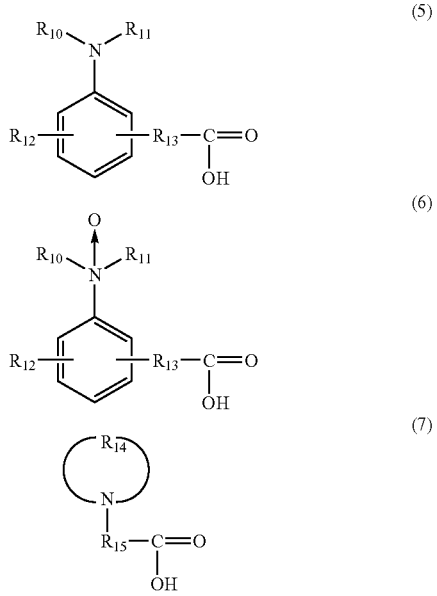

In the formulae, $R_{10}$ and $R_{11}$ each represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; $R_{10}$ and $R_{11}$ may be bonded to form a cyclic structure; $R_{12}$ represents a hydrogen atom, or a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, an alkyl thioalkyl group having 1 to 10 carbon atoms, or a halogen group; $R_{13}$ represents a linear, a branched, or a cyclic alkylene group having 0 to 20 carbon atoms, or an arylene group having 6 to 20 carbon atoms; $R_{14}$ represents a linear or a branched alkylene group, substituted or unsubstituted, having 2 to 20 carbon atoms which may contain one or a plurality of a carbonyl group, an ether group, an ester group, and a sulfide between the carbon-carbon bond of the alkylene group; and $R_{15}$ represents a linear, a branched, or a cyclic alkylene group having 1 to 20 carbon atoms, or an arylene group having 6 to 20 carbon atoms.

Without any limitations, examples of the aryl group having 6 to 20 carbon atoms concretely include a phenyl group, naphthyl group, anthryl group, phenanthryl group, pyrenyl group, naphthacenyl group, and fluorenyl group; examples of the linear, branched, or cyclic alkyl group having 1 to 20 carbon atoms concretely include a methyl group, ethyl group, propyl group, isopropyl group, butyl group, isobutyl group, t-butyl group, pentyl group, hexyl group, decyl group, cyclopentyl group, cyclohexyl group, and decahydronaphthalenyl group; examples of the aralkyl group having 7 to 20 carbon atoms concretely include a benzyl group, phenethyl group, phenylpropyl group, naphthylmethyl group, naphthylethyl group, and anthracenylmethyl group; examples of the hydroxyalkyl group having 2 to 10 carbon atoms concretely include a hydroxymethyl group, hydroxyethyl group, and hydroxypropyl group; examples of the alkoxyalkyl group having 2 to 10 carbon atoms concretely include a methoxymethyl group, ethoxymethyl group, propoxymethyl group, isopropoxymethyl group, butoxymethyl group, isobutoxymethyl group, tert-butoxymethyl group, tert-amyloxymethyl group, cyclohexyloxymethyl group, cyclopentyloxymethyl group; examples of the acyloxyalkyl group having 3 to 10 carbon atoms concretely include a formyloxymethyl group, acetoxymethyl group, propionyloxymethyl group, butyryloxymethyl group, pivaloyloxymethyl group, cyclohexane carbonyloxymethyl group, and decanoyloxymethyl group; examples of the alkylthio-alkyl group having 1 to 10 carbon atoms concretely include a methylthiomethyl group, ethylthiomethyl group, propylthiomethyl group, isopropylthiomethyl group, butylthiomethyl group, isobutylthiomethyl group, t-butylthiomethyl group, t-amylthiomethyl group, decylthiomethyl group, and cyclohexylthiomethyl group; examples of the alkylene group having 1 to 20 carbon atoms concretely include a methylene group, ethylene group, methylethylene group, dimethylethylene group, propylene group, methylpropylene group, butylene group, pentylene group, hexylene group, decanyl group, cyclopentylene group, cyclohexylene group, methylenecyclohexylene group, decahydronaphthalenylene group; and examples of the arylene group having 6 to 20 carbon atoms concretely include phenylene group, naphthylene group, anthrylene group, phenanthrylene group, pyrenylene group, naphthacenylene group, and fluorenylene group.

Preferable examples of the amine compounds represented by the general formula (5) will be concretely enumerated below, without limited thereto.

Namely, such examples include: o-dimethylaminobenzoic acid, p-dimethylaminobenzoic acid, m-dimethylaminobenzoic acid, p-diethylaminobenzoic acid, p-dipropylaminobenzoic acid, p-diisopropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalene acid, 3-diethylamino-2-naphthalene acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllactic acid, 2-(4-dimethylaminophenyl) benzoic acid, and 2-(4-(dibutylamino)-2-hydroxybenzoyl) benzoic acid.

Preferable example of the amine oxide compound represented by the general formula (6) is compound obtained by oxidizing each of the amine compounds represented by the general formula (5) and concretely enumerated above, without limited thereto.

Preferable examples of the amine compound represented by the general formula (7) will be concretely enumerated below, without limited thereto.

Namely, examples thereof include 1-piperidinepropionic acid, 1-piperidinebutyric acid, 1-piperidinemalic acid, 1-piperidinepyruvic acid, 1-piperidinelactic acid, and the like.

The compound represented by the general formula (6) having an amine oxide structure are to be produced by selecting optimum techniques corresponding to the structures of the compounds, respectively. Examples thereof include a technique to adopt an oxidation reaction using an oxidizing agent for a nitrogen-containing compound, and a technique to adopt an oxidation reaction of a nitrogen-containing compound in a diluted solution of hydrogen peroxide, without limited thereto. This will be explained in detail.

Exemplarily described below is a production method of a nitrogen-containing alcohol compound by an esterification reaction, and this is also applicable to synthesis of the amine oxide compound represented by the general formula (6).

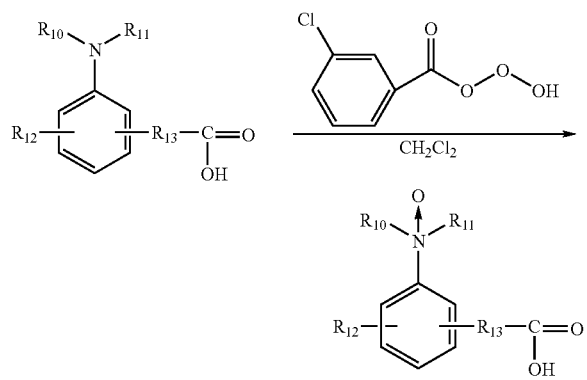

In the formulae, $R_{10}$, $R_{11}$, $R_{12}$, and $R_{13}$ are same as before.

In the above formula, although this reaction is an oxidation reaction of amine adopting an oxidizing agent (m-chloroperbenzoic acid), this reaction can be conducted by another oxidizing agent in a usual manner of an oxidation reaction. After the reaction, mixed reaction products can be purified by usual manners such as distillation, chromatography, recrystallization, and the like.

In these amine compounds or amine oxide compounds having a carboxyl group and not having a hydrogen atom covalently bonded to a base-center nitrogen atom, the existence of a functional group substituted with a nitrogen atom has made possible to capture the generated acid rapidly while the carboxyl group is arranged on the substrate side so that an effect to prevent the generated acid from inactivation caused by diffusion to the substrate may be expected. As a result of the foregoing, it may be assumed that a pattern profile having a high resolution and an excellent verticality at the substrate's interface can be obtained.

Accordingly, a negative resist composition giving an even better pattern profile can be prepared by appropriately adjusting the amine compound or the amine oxide compound having a carboxyl group and not having a hydrogen atom covalently bonded to a base-center nitrogen atom in accordance with its physical properties such as volatility, basicity, a capturing rate of an acid, and a diffusion rate in a resist, and also in accordance with a combination of a base resin (A) and with an acid generator (B) to be used.

Therefore, a tertiary amine not having a hydrogen atom covalently bonded to a base-center nitrogen atom is preferable to the one like a primary amine—which is an amine or an amine oxide compound having a hydrogen atom covalently bonded to a base-center nitrogen atom—in order to have the remedy effect of the undercut to a maximum extent.

Further, a basic component not having a hydrogen atom covalently bonded to a base-center nitrogen atom—other than the amine compound or an amine oxide compound, like a weak base such as 2-quinoline carboxylic acid and nicotinic acid, whose base-center nitrogen is incorporated into an aromatic ring—has its carboxyl group arranged appropriately on the substrate side, so that the generated acid can be prevented from deactivation caused by its diffusion into the substrate.

As mentioned above, the foregoing effect of suppressing the undercut formation by the amine or the amine oxide compound having a carboxyl group and not having a hydrogen atom covalently bonded to a base-center nitrogen inside a molecule is realized by localization of the carboxyl group near the substrate even more. Accordingly, in order to have this effect of suppressing the undercut formation, it is not necessary that the entire basic component (C) be the amine or the amine oxide compound having a carboxyl group and not having a hydrogen atom covalently bonded to a base-center nitrogen; thus it can be used in a combination with a conventionally used basic component other than the amine compound or the amine oxide compound having carboxyl group and not having a hydrogen atom covalently bonded to a base-center nitrogen.

When an amine compound or an amine oxide compound having a carboxyl group and not having a hydrogen atom covalently bonded to a base-center nitrogen is used as a mixture with an amine compound or amine oxide compound used conventionally, other than the amine compound or the amine oxide compound having carboxyl group and not having a hydrogen atom covalently bonded to a base-center nitrogen, as mentioned above, the blending ratio (mass ratio) of the foregoing amine or amine oxide compound having a carboxyl group and not having a hydrogen atom covalently bonded to a base-center nitrogen to the other amine or amine oxide compound is preferably in the range of 100:0 to 10:90.

When an amine compound or an amine oxide compound having a carboxyl group and not having an active hydrogen atom is used as a mixture with an amine compound or amine oxide compound other than the amine compound or the amine oxide compound having carboxyl group and not having a hydrogen atom covalently bonded to a base-center nitrogen, an amine compound or an amine oxide compound represented by following general formula (8) or (9) are preferably used as the amine compound or amine oxide compound other than the amine compound or the amine oxide compound having carboxyl group and not having a hydrogen atom covalently bonded to a base-center nitrogen.

(8)

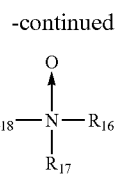

(9)

In the formulae, $R_{16}$, $R_{17}$, and $R_{18}$ each represents a hydrogen atom, or a linear, a branched, or a cyclic alkyl group having 1 to 20 carbon atoms, an aryl group having 6 to 20 carbon atoms, an aralkyl group having 7 to 20 carbon atoms, a hydroxyl alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; two of $R_{16}$, $R_{17}$, and $R_{18}$ may be bonded to form a cyclic structure or an aromatic ring.

An organic solvent used for preparing the negative resist composition of the present invention are any organic solvents in which the base resin, the acid generator, the basic component, other additives, and the like are soluble. Examples of the organic solvents include: ketones such as cyclohexanone and methyl-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone; which can be used solely, or mixedly in two or more kinds, without limited thereto. Desirably usable in the present invention among them, are ethyl lactate, propylene glycol monomethyl ether, propylene glycol monomethyl ether acetate, and mixed solvents of them, since they are most excellent in solubility for the acid generator in the negative resist composition.

The amount of an organic solvent to be used is preferably in the range of 1,000 to 10,000 parts by mass, in particular in the range of 1,400 to 9,700 parts by mass, relative to 100 parts by mass of the base resin. By adjusting the concentration in the range like this, a resist film having the film thickness of 50 to 100 nm can be obtained constantly and with a high smoothness by using a spin-coating method.

Other than the components as mentioned above, the negative resist composition of the present invention may contain a surfactant (D) that is used conventionally as an arbitrary component to improve the coating properties. Meanwhile, the adding amount of the arbitrary component can be made to a usual amount, in the range not damaging the effects of the present invention.

The surfactant is not particularly restricted, and examples of it include polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane aliphatic acid ester such as sorbitane monolaurate, sorbitane monovalmitate, and sorbitane monostearate; a nonionic surfactant of a polyoxyethylene sorbitane aliphatic acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Flolade FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.). Further, a polymer-type surfactant obtained by ring-opening polymerization of a fluorinated oxetane is preferably used because it has a merit not much affecting the resist coating properties. As for the example of it, PF-636 (manufactured by OMNOVA Solutions Inc.) may be mentioned. These surfactants may be used singly or in a combination of two or more kinds of them.

The adding amount of the surfactant in the negative resist composition of the present invention is preferably 2 or less parts by mass, and more preferably 1 or less part by mass, relative to 100 parts by mass of the base resin (A) in the negative resist composition.

In the patterning process of the present invention, at least, a resist film having the film thickness of 50 to 100 nm is formed on a substrate to be processed by using the foregoing negative resist composition, and then the resist film is exposed to a high energy beam and thereafter developed by an alkaline developer to obtain a resist pattern.

Firstly, formation of the resist film onto the substrate to be processed by using the negative resist composition of the present invention is done via a coating step of the negative resist composition of the present invention onto the substrate to be processed and a pre-baking step thereafter, wherein any of these steps is carried out by a heretofore known method, so that a resist film having the film thickness of 50 to 100 nm, depending on the purpose, can be formed.

As to the coating step, there are several known coating methods other than a spin-coating method; but when a thin film having the resist film thickness of in the range of 50 to 100 nm is formed, the use of a spin-coating method is preferable in order to obtain a uniform film thickness.

In the case that the substrate to be processed is a semiconductor wafer, coating conditions at the time of a spin-coating need to be tailored according to a wafer size, an intended film thickness, a composition of the negative resist composition, and the like. In order to obtain the film thickness of about 100 nm by using an 8-inch wafer, the negative resist composition is cast on the wafer, which is then followed by rotation at the rotation speed of 4,000 to 5,000 revolutions/minute for 40 seconds; by it a resist film having a high uniformity can be formed. Here, the use amount of the solvent to prepare the negative resist composition is preferably in the range of 1,400 to 1,600 parts by mass relative to 100 parts by mass of the base resin.

Then, the resist film formed by the method as mentioned above is pre-baked in order to remove an excess solvent remained in the film. The conditions of the pre-bake, when it is done on a hot plate, are: usually the temperature range of 80 to 130° C. and the time range of 1 to 10 minutes, and preferably 90 to 110° C. and 3 to 5 minutes.

In the case that the substrate to be processed is a photomask blank, the coating conditions need to be tailored according to a blank size, an intended film thickness, a composition of the resist composition, and the like, by the same token. When the film thickness of about 100 nm is intended to be formed on a square blank with 15.2 cm×15.2 cm, the resist film having a high uniformity can be formed, after the resist composition is cast on the blank, by rotating it with the rotation speed of 1,000 to 3,000 revolutions/minute for 2 seconds, and then with the rotation speed of 800 revolutions/minute or less for 30 seconds. Here, the use amount of the solvent to prepare the negative resist composition is preferably in the range of 2,000 to 9,700 parts by mass relative to 100 parts by mass of the base resin.

Then, the resist film formed by the method as mentioned above is pre-baked in order to remove an excess solvent remained in the film. The conditions of the pre-bake, when the pre-bake is done on a hot plate, are: usually the temperature range of 80 to 130° C. and the time range of 4 to 20 minutes, and preferably 90 to 110° C. and 8 to 12 minutes.

Subsequently, the resist film obtained as mentioned above is subjected to the light exposure to form an intended resist pattern. The exposure is done, in the case of a semiconductor processing, by covering above the foregoing resist film with a mask to form an intended pattern, and a high energy beam, such as a far-infrared beam, an excimer laser, an X-ray, and an electron beam, is used with the exposure dose being in the range of 1 to 100 $\mu C/cm^2$ and preferably in the range of 10 to 100 $\mu C/cm^2$. In addition to an ordinary exposure method, an immersion method, in which the space between a projection lens and a resist film is immersed in a liquid, can also be used as appropriate.

In the case of processing a photomask blank, a pattern exposure is usually done by a beam exposure because many of the identical products are not intended to be made by the processing. A high energy beam of an electron beam is generally used, but the other foregoing beams can also be used as the light source by the same token.

Usually after the exposure, in order to carry out a chemical amplification reaction by diffusing the acid, a post-exposure bake (PEB) is done as appropriate; for example, on a hot plate in the temperature range of 60 to 150° C. and in the time range of 0.1 to 5 minutes, preferably 80 to 140° C. and 0.5 to 3 minutes.

Then, the development is done to form an intended pattern on the substrate by using an aqueous alkaline developer such as tetramethyl ammonium hydroxide (TMAH) with a concentration ranging from 0.1 to 5% by mass, preferably 2 to 3% by mass, with a time ranging from 0.1 to 3 minutes, preferably 0.5 to 2 minutes, and with an ordinary method such as a dip method, a puddle method, and a spray method. In addition, the pattern size can be adjusted by a further heat treatment (thermal flow) after the development, as appropriate.

In this case of the patterning process of the present invention, the dissolution rate of the resist film having the film thickness (X) of 50 to 100 nm is made 0.0333X−1.0 (nm/second) or more and 0.0667X−1.6 (nm/seconds) or less. By using the resist patterning process as mentioned above, formation of the undercut can be suppressed; thus a resist pattern with a high resolution and a desirable form can be obtained even when the pattern having the minimum line width of 50 nm or less is formed by using a thin resist film like the one having the film thickness of 50 to 100 nm.

Incidentally, the negative resist composition of the present invention is most suitably used for fine patterning by a high energy beam, in particular, a far-ultraviolet beam or an excimer laser having the wavelength of 250 to 120 nm, an extreme ultraviolet beam, an X-ray, and an electron beam.

As to the substrate to be processed for a lithography applied with a patterning process using the negative resist composition of the present invention, any substrate such as, for example, a semiconductor wafer, an intermediate substrate in the semiconductor manufacturing, and a photomask substrate etc., can be used as far as it uses a lithography by a photoresist, though a substrate having a film formed of a metal compound by such a method as spattering can realize the effects of the present invention advantageously.

Especially in a photomask blank formed of chromium compound film on the outermost surface as a light-shielding film or as an etching mask film, form control of the resist pattern at the substrate's interface is so difficult that the effects of the present invention are eminently expressed. Examples of the chromium compound usefully applied by the present invention in the substrate's outermost surface material include a metal chromium, chromium oxide, chromium nitride, chromium carbide, chromium oxynitride, chromium oxycarbide, chromium carbonitride, and chromium oxycarbonitride.

Examples

Hereinafter, the present invention with regard to a chemically amplified negative resist composition containing (A) a base resin that is alkaline-soluble and is made alkaline-insoluble by action of an acid, (B) an acid generator generating an acid by exposure to a energy beam, and (C) a compound containing a nitrogen as a basic component will be explained specifically by Examples and Comparative Examples, but the present invention is not limited to the Examples as described below.

The structures of (A) the base resins (Polymer 1 to 10) and of (B) the acid generators (PAG-1 and PAG-2) used in Examples and Comparative Examples are shown below.

The molecular weights (Mw) of the base polymers are measured with a gel permeation chromatography, and any of them is 5,000 based on the polystyrene standard (Mw/Mn=1.5).

The dissolution rate of the base resin into the alkaline developer (an aqueous solution of 2.38% tetramethyl ammonium hydroxide) was determined as follows. Namely, 10 parts by mass of only the base resin as the solid component was dissolved into 30 parts by mass of propylene glycol monomethyl ether acetate; the thus prepared solution was applied onto a Si substrate by spin-coating and then baked at 150° C. for 90 seconds to obtain a base resin film having the film thickness of about 2,000 nm. Subsequently, the alkaline developer was supplied onto this film to develop by a puddle development for 10 seconds. The film thickness before and after the development were measured with Lambda Ace (VM-1210), a film thickness measuring instrument, to obtain the amount of film loss; the dissolution rate of the base resin was calculated by using an experimental equation ([Dissolution Rate]=([Film Loss]/10+17.6)/0.73 (nm/second)) for obtaining an initial dissolution rate of the film having an extremely fast dissolution rate.

Polymer-1 is the one shown by the following general formula (1'), wherein X is a chlorine group and R is an acetyl group; p=75, q=12, and t=13; and the dissolution rate into the alkaline developer is 45 nm/second.

Polymer-2 is the one shown by the following general formula (1'), wherein X is a chlorine group and R is a naphthoyl group; p=75, q=12, and t=13; and the dissolution rate into the alkaline developer is 40 nm/second.

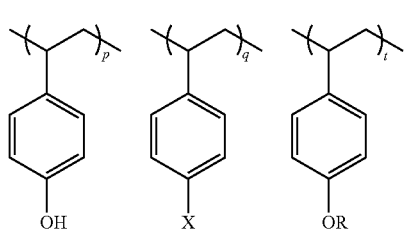

(1')

Polymer-3 is the one shown by the following general formula (2'), wherein X is a chlorine group and R is an acetyl group; p=74, q=12, r=12, and t=2; and the dissolution rate into the alkaline developer is 32 nm/second.

Polymer-4 is the one shown by the following general formula (2'), wherein X is a chlorine group and R is an acetyl group; p=76, q=12, r=12, and t=0; and the dissolution rate into the alkaline developer is 36 nm/second.

Polymer-5 is the one shown by the following general formula (2'), wherein X is a chlorine group and R is an acetyl group; p=73, q=12, r=15, and t=0; and the dissolution rate into the alkaline developer is 28 nm/second.

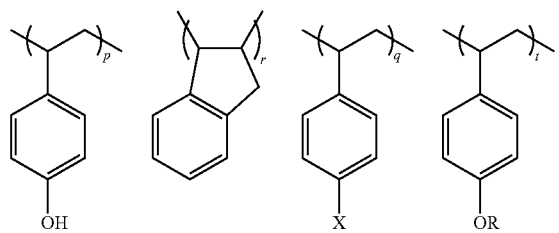

(2')

Polymer-6 is the one shown by the following general formula (3'), wherein X is a chlorine group and R is an acetyl group; p=74, q=12, s=12, and t=2; and the dissolution rate into the alkaline developer is 30 nm/second.

Polymer-7 is the one shown by the following general formula (3'), wherein X is a chlorine group and R is an acetyl group; p=76, q=12, s=12, and t=0; and the dissolution rate into the alkaline developer is 34 nm/second.

Polymer-8 is the one shown by the following general formula (3'), wherein X is a chlorine group and R is an acetyl group; p=73, q=12, s=15, and t=0; and the dissolution rate into the alkaline developer is 26 nm/second.

Polymer-9 is the one shown by the following general formula (3'), wherein X is a chlorine group and R is an acetyl group; p=70, q=12, s=15, and t=3; and the dissolution rate into the alkaline developer is 20 nm/second.

Polymer-10 is the one shown by the following general formula (3'), wherein X is a chlorine group and R is an acetyl group; p=70, q=12, s=18, and t=0; and the dissolution rate into the alkaline developer is 16 nm/second.

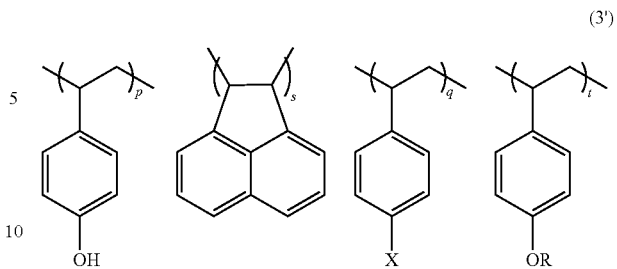

(3')

PAG-1 is the one shown by the following general formula (4'), wherein $R_4$ represents a tertiary butyl group; $R_5$ and $R_6$ represent a hydrogen atom; and $R_7$, $R_8$, and $R_9$ represent an isopropyl group.

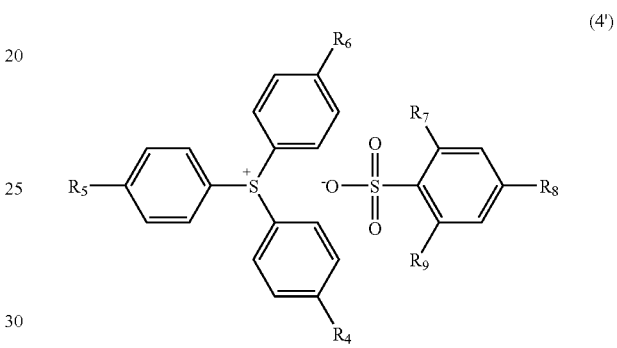

(4')

PAG-2 is triphenyl sulfonium p-xylenebenzene sulfonic acid.

Organic solvents used in Examples and Comparative Examples are as follows.
Solvent (A): Propylene glycol methyl ether (PGME)
Solvent (B): Ethyl lactate (EL)
Solvent (C): Propylene glycol monomethyl ether acetate (PGMEA)

An amine compound having a carboxyl group but not having an active hydrogen or a basic compound not having a carboxyl group (Quenchers 1 to 6), used as the basic component (C) in Examples and Comparative Examples, are as follows.
Quencher-1: p-Diethylamino benzoic acid
Quencher-2: p-Dibutylamino benzoic acid
Quencher-3: 1-Piperidine propionic acid
Quencher-4: Tris(2-(methoxymethoxy)ethyl)amine
Quencher-5: Oxide of tris(2-(methoxymethoxy)ethyl)amine
Quencher-6: N-2-(acetoxy)ethyl-imidazole
The following compound is used as the surfactant (D).
Surfactant A: PF-636 (manufactured by OMNOVA Solutions Inc.)
The following compound is used as the crosslinker.
Crosslinker: Tetramethoxy methyl glycoluril Examples 1 to 6 and Comparative Examples 1 to 3

A base resin, an acid generator, a basic component, an organic solvent, a surfactant, and a crosslinker, as mentioned above, were mixed according to the following Table 1 to prepare the respective negative resist compositions for Examples 1 to 6 and for Comparative Examples 1 to 3.

TABLE 1

| composition (parts by mass) | Ex. 1 | Ex. 2 | Ex. 3 | Ex. 4 | Com. Ex. 1 | Ex. 5 | Ex. 6 | Com. Ex. 2 | Com. Ex. 3 |
|---|---|---|---|---|---|---|---|---|---|
| polymer-1 | 80 | | | | | | | | |
| polymer-2 | | 80 | | | | | | | |
| polymer-3 | | | 80 | | | | | | |
| polymer-4 | | | | 80 | | | | | 80 |
| polymer-5 | | | | | 80 | | | | |
| polymer-6 | | | | | | 80 | | | |
| polymer-7 | | | | | | | 80 | | |
| polymer-8 | | | | | | | | 80 | |
| PAG-1 | 10 | 10 | 10 | 10 | 10 | 10 | 10 | 10 | |
| PAG-2 | | | | | | | | | 10 |
| Quencher-1 | 0.1 | 0.1 | 0.1 | 0.1 | 0.1 | 0.1 | 0.1 | 0.1 | 0.1 |
| Quencher-2 | 0.1 | 0.1 | 0.1 | 0.1 | 0.1 | 0.1 | 0.1 | 0.1 | 0.1 |
| Crosslinker | 8.2 | 8.2 | 8.2 | 8.2 | 8.2 | 8.2 | 8.2 | 8.2 | 8.2 |
| surfactant A | 0.07 | 0.07 | 0.07 | 0.07 | 0.07 | 0.07 | 0.07 | 0.07 | 0.07 |
| solvent (A) | 800 | 800 | 800 | 800 | 800 | 800 | 800 | 800 | 800 |
| solvent (B) | 800 | 800 | 800 | 800 | 800 | 800 | 800 | 800 | 800 |
| solvent (C) | 1,000 | 1,000 | 1,000 | 1,000 | 1,000 | 1,000 | 1,000 | 1,000 | 1,000 |

The obtained negative resist composition was filtrated through a 0.04 μm filter made of nylon resin; then this resist solution was applied onto a square photomask blank with 152 mm on a side whose outermost film is formed of chromium oxynitride by spin-coating at the rotation speed of 1,700 revolutions/minute to obtain the film having the film thickness of 90 nm.

Thereafter, this photomask blank was baked on a hot plate at 110° C. for 10 minutes to obtain a resist film.

The film thickness (X) was measured by using an optical measurement instrument NanoSpec (manufactured by Nanometrics Inc.). The measurements were made on 81 spots in the plane of the blank substrate except for a peripheral area within 10 mm from the blank periphery to obtain the average film thickness and the film thickness range by calculation.

Then, the exposure was made with an electron beam exposure instrument EBM 5000 (manufactured by NuFlare Technology, Inc., acceleration voltage of 50 keV), which was followed by the post-exposure bake (PEB) at 120° C. for 10 minutes and then the development by a spray-development with a 2.38% aqueous tetramethyl ammonium hydroxide solution to form a negative resist pattern.

The resist patterns thus obtained were evaluated as follows.

The exposure dose at which a top and a bottom of the 200-nm line-and-space was resolved with 1:1 was taken as the optimum exposure dose (sensitivity: Eop), and the minimum line width of a separated line-and-space at this exposure dose was taken as the resolution of the resist to be evaluated. And the resolved resist pattern profile was observed on a cross section of the resist pattern by using a scanning electron microscope with regard to whether or not the undercut formation had occurred especially at the substrate's interface.

The dissolution rate of the resist film formed from each negative resist composition into the alkaline developer (aqueous solution of 2.38% tetramethyl ammonium hydroxide) was measured as following: the negative resist composition shown in Table 1 was applied on a Si substrate, baked at 110° C., developed by a puddle development for 10 seconds, and then the film thickness was measured before and after the development respectively by using a film thickness measurement instrument Lambda Ace (VM-1210) for calculation. Namely, the amount of the film loss after development was divided by 10 seconds, the value of which was taken as the dissolution rate (nm/s) of the resist film into the alkaline developer.

Evaluation results of the resolution, the pattern's cross section form, and the dissolution rate of the resist film into the alkaline developer are shown in Table 2.

TABLE 2

| | resolution (nm) | pattern's cross section profile | dissolution rate into the alkaline developer (nm/s) |
|---|---|---|---|
| Ex. 1 | 50 | Good | 4.1 |
| Ex. 2 | 50 | Good | 3.7 |
| Ex. 3 | 50 | Good | 2.2 |
| Ex. 4 | 50 | Good | 2.6 |
| Com. Ex. 1 | 60 | Good | 1.8 |
| Ex. 5 | 50 | Good | 2.0 |
| Ex. 6 | 50 | Good | 2.4 |
| Com. Ex. 2 | 70 | Good | 1.3 |
| Com. Ex. 3 | 90 | undercut | 4.8 |

When the dissolution rate of the resist film into the alkaline developer was in the range of 2.0 nm/second or more and 4.4 nm/second or less, the 50-nm pattern could be formed without undercut formation. When the dissolution rate was less than 2.0 nm/second, namely in Comparative Example 1 and Comparative Example 2, the undercut formation was not observed, but the residual development was observed between the 50-nm patterns, showing that resolution of the 50-nm pattern was difficult.

As in the case of Comparative Example 3, when the dissolution rate was more than 4.4 nm/second, the undercut formation was observed in the pattern, resulting in the collapse of the 50-nm pattern.

Meanwhile, when the resist composition containing the solute components (base resin, acid generator, basic component, and surfactant) in Comparative Example 3 was used as they were while only the solvent amount was changed, the pattern without undercut formation could be obtained in the resist film having the film thickness of 150 nm. This is the example that the undercut formation is eminent in the resist film having the film thickness of 100 nm or less when the conventional resist composition is used in which the composition is adjusted so as to give its dissolution rate far more than 4.4 nm/second in order that the scum is not formed, as mentioned above.

Comparison of the dissolution rate of the resist film in Example 4 with that in Comparative Example 3 reveals that the anti-dissolution effect is larger in PAG-1 than in PAG-2.

Examples 7 to 10

The negative resist composition of the present invention was prepared by mixing PAG-1 and PAG-2 (acid generators of the negative resist composition) in accordance with the following Table 3 so that the dissolution rate of the resist film into the alkaline developer might become in the range of 2.0 nm/second or more and 4.4 nm/second or less; then the negative resist pattern was formed in the same way as the foregoing Examples 1 to 6. Evaluation results of the resolution and the pattern profile of them, including the results of dissolution rate of the resist film into the alkaline developer, are shown in the following Table 4.

TABLE 3

| composition (parts by mass) | Ex. 7 | Ex. 8 | Ex. 9 | Ex. 10 |
|---|---|---|---|---|
| polymer-5 | 80 | | | |
| polymer-8 | | 80 | | |
| polymer-9 | | | 80 | |
| polymer-10 | | | | 80 |
| PAG-1 | 8 | 6 | 2 | 1 |
| PAG-2 | 2 | 4 | 8 | 9 |
| Quencher-1 | 0.1 | 0.1 | 0.1 | 0.1 |
| Quencher-3 | 0.1 | 0.1 | 0.1 | 0.1 |
| crosslinker | 8.2 | 8.2 | 8.2 | 8.2 |
| surfactant A | 0.07 | 0.07 | 0.07 | 0.07 |
| solvent (A) | 800 | 800 | 800 | 800 |
| solvent (B) | 800 | 800 | 800 | 800 |
| solvent (C) | 1,000 | 1,000 | 1,000 | 1,000 |

TABLE 4

| | resolution (nm) | pattern's cross section profile | dissolution rate into the alkaline developer (nm/s) |
|---|---|---|---|
| Ex. 7 | 50 | Good | 2.4 |
| Ex. 8 | 50 | Good | 2.2 |
| Ex. 9 | 50 | Good | 2.3 |
| Ex. 10 | 50 | Good | 2.1 |

When the negative resist composition was prepared so that the dissolution rate of the resist film into the alkaline developer might become in the range of 2.0 nm/second or more and 4.4 nm/second or less, the 50-nm pattern could be obtained without undercut formation in any of these Examples.

Examples 11 to 14

The negative resist composition of the present invention was prepared by mixing the base resins having different dissolution rates into the alkaline developer in accordance with the following Table 5 so that the dissolution rate of the resist film into the alkaline developer might become in the range of 2.0 nm/second or more and 4.4 nm/second or less; then the negative resist pattern was formed in the same way as the foregoing Examples 1 to 6. Evaluation results of the resolution and the pattern profile of them, including the results of the dissolution rate of the resist film into the alkaline developer, are shown in the following Table 6.

TABLE 5

| composition (parts by mass) | Ex. 11 | Ex. 12 | Ex. 13 | Ex. 14 |
|---|---|---|---|---|
| polymer-1 | 40 | | | |
| polymer-2 | | 40 | | 40 |
| polymer-4 | | | 40 | |
| polymer-5 | | | 40 | |
| polymer-8 | | | | 40 |
| polymer-9 | | 40 | | |
| polymer-10 | 40 | | | |
| PAG-1 | 10 | 10 | 10 | 10 |
| Quencher-1 | 0.1 | 0.1 | 0.1 | 0.1 |
| Quencher-3 | 0.1 | 0.1 | 0.1 | 0.1 |
| crosslinker | 8.2 | 8.2 | 8.2 | 8.2 |
| surfactant A | 0.07 | 0.07 | 0.07 | 0.07 |
| solvent (A) | 800 | 800 | 800 | 800 |
| solvent (B) | 800 | 800 | 800 | 800 |
| solvent (C) | 1,000 | 1,000 | 1,000 | 1,000 |

TABLE 6

| | resolution (nm) | pattern's cross section profile | dissolution rate into the alkaline developer (nm/s) |
|---|---|---|---|
| Ex. 11 | 50 | Good | 2.4 |
| Ex. 12 | 50 | Good | 2.4 |
| Ex. 13 | 50 | Good | 2.2 |
| Ex. 14 | 50 | Good | 2.5 |

When the negative resist composition was prepared so that the dissolution rate of the resist film into the alkaline developer might become in the range of 2.0 nm/second or more and 4.4 nm/second or less, the 50-nm pattern could be obtained without undercut formation in any of the Examples.

Examples 15 to 20

As the basic components of the present invention, an amine compound having a carboxyl group and not having a hydrogen atom covalently bonded to a base-center nitrogen was mixed with an amine compound not having a carboxyl group in accordance with the following Table 7. Here, the negative resist composition of the present invention was prepared by mixing Polymer-4 (base resin) and PAG-1 (acid generator) in accordance with the following Table 7 so that the dissolution rate of the resist film into the alkaline developer might become in the range of 2.0 nm/second or more and 4.4 nm/second or less; then the negative resist pattern was formed in the same way as the foregoing Examples 1 to 6. The resolution and the pattern profile of them were evaluated. The sensitivity of the resist film to an electron beam is also shown in Table 7.

TABLE 7

| composition (parts by mass) | Ex. 15 | Ex. 16 | Ex. 17 | Ex. 18 | Ex. 19 | Ex. 20 |
|---|---|---|---|---|---|---|
| polymer-4 | 80 | 80 | 80 | 80 | 80 | 80 |
| PAG-1 | 10 | 10 | 10 | 10 | 10 | 10 |
| Quencher-1 | 0.1 | 0.1 | 0.1 | | | |

TABLE 7-continued

| composition (parts by mass) | Ex. 15 | Ex. 16 | Ex. 17 | Ex. 18 | Ex. 19 | Ex. 20 |
|---|---|---|---|---|---|---|
| Quencher-3 | | | | 0.1 | 0.2 | 0.3 |
| Quencher-4 | 0.2 | | | | | |
| Quencher-5 | | 0.2 | | | | |
| Quencher-6 | | | 0.2 | | | |
| crosslinker | 8.2 | 8.2 | 8.2 | 8.2 | 8.2 | 8.2 |
| surfactant A | 0.07 | 0.07 | 0.07 | 0.07 | 0.07 | 0.07 |
| solvent (A) | 800 | 800 | 800 | 800 | 800 | 800 |
| solvent (B) | 800 | 800 | 800 | 800 | 800 | 800 |
| solvent (C) | 1,000 | 1,000 | 1,000 | 1,000 | 1,000 | 1,000 |
| sensitivity to an electron beam $\mu C/cm^2$ | 13 | 13 | 13 | 8 | 14 | 20 |

Any resist film obtained from the compositions of the foregoing Examples 15 to 20 gave the same dissolution rate as that in Example 4, the 50-nm pattern could be formed without undercut formation in the resolution test in any of these Examples. When the amount of the amine compound was increased (Examples 18 to 20), the sensitivity was decreased but the resolution was not damaged. Accordingly, it was found that the sensitivity required in the process could be adjusted by the amount of the basic component.

Examples 21 to 26 and Comparative Examples 4 to 7

In the negative resist compositions used in Examples and Comparative Examples, the resist composition having a low composition's concentration was prepared in accordance with the following Table 8. The negative resist pattern was formed from it in the same way as Examples 1 to 8, and then the resolution and the pattern profile of it were evaluated. Because of the lowered concentration of the resist composition, the film thickness became thinner to 60 nm under the same coating conditions as Examples 1 to 6.

Evaluation results of the resolution, the pattern's cross section, and the dissolution rate of the resist film into the alkaline developer are shown in Table 9.

TABLE 9

| | resolution (nm) | pattern's cross section profile | dissolution rate into the alkaline developer (nm/s) |
|---|---|---|---|
| Com. Ex. 4 | 60 | undercut | 4.1 |
| Com. Ex. 5 | 50 | undercut | 3.7 |
| Ex. 21 | 40 | good | 2.2 |
| Com. Ex. 6 | 50 | undercut | 2.6 |
| Ex. 22 | 40 | good | 1.8 |
| Ex. 23 | 40 | good | 2.0 |
| Ex. 24 | 40 | good | 2.4 |
| Ex. 25 | 40 | good | 1.3 |
| Ex. 26 | 40 | good | 1.0 |
| Com. Ex. 7 | 60 | good | 0.7 |

When the dissolution rate of the resist film was in the range of 1.0 nm/second or more and 2.4 nm/second or less, the 40-nm pattern could be resolved without undercut formation. When the film thickness was 90 nm, the residual development was observed between the 50-nm patterns in Comparative Example 1 and Comparative Example 2 where the dissolution rate was less than 2.0 nm/second. On the other hand, when the film thickness was 60 nm, the 40-nm pattern could be

TABLE 8

| composition (parts by mass) | Com. Ex. 4 | Com. Ex. 5 | Ex. 21 | Com. Ex. 6 | Ex. 22 | Ex. 23 | Ex. 24 | Ex. 25 | Ex. 26 | Com. Ex. 7 |
|---|---|---|---|---|---|---|---|---|---|---|
| polymer-1 | 80 | | | | | | | | | |
| polymer-2 | | 80 | | | | | | | | |
| polymer-3 | | | 80 | | | | | | | |
| polymer-4 | | | | 80 | | | | | | |
| polymer-5 | | | | | 80 | | | | | |
| polymer-6 | | | | | | 80 | | | | |
| polymer-7 | | | | | | | 80 | | | |
| polymer-8 | | | | | | | | 80 | | |
| polymer-9 | | | | | | | | | 80 | |
| polymer-10 | | | | | | | | | | 80 |
| PAG-1 | 10 | 10 | 10 | 10 | 10 | 10 | 10 | 10 | 10 | 10 |
| Quencher-1 | 0.1 | 0.1 | 0.1 | 0.1 | 0.1 | 0.1 | 0.1 | 0.1 | 0.1 | 0.1 |
| Quencher-2 | 0.1 | 0.1 | 0.1 | 0.1 | 0.1 | 0.1 | 0.1 | 0.1 | 0.1 | 0.1 |
| crosslinker | 8.2 | 8.2 | 8.2 | 8.2 | 8.2 | 8.2 | 8.2 | 8.2 | 8.2 | 8.2 |
| Surfactant A | 0.07 | 0.07 | 0.07 | 0.07 | 0.07 | 0.07 | 0.07 | 0.07 | 0.07 | 0.07 |
| solvent (A) | 800 | 800 | 800 | 800 | 800 | 800 | 800 | 800 | 800 | 800 |
| solvent (B) | 1600 | 1600 | 1600 | 1600 | 1600 | 1600 | 1600 | 1600 | 1600 | 1600 |
| solvent (C) | 2,000 | 2,000 | 2,000 | 2,000 | 2,000 | 2,000 | 2,000 | 2,000 | 2,000 | 2,000 | resolved without the residual development even if the dissolution rate was less than 2.0 nm/second, in Example 22 (1.8 nm/second) and Example 25 (1.3 nm/second).

In the Comparative Example 7 where the dissolution rate was less than 1.0 nm/second, the residual development was observed between the 40-nm patterns though the undercut was not formed, and thus the 40-nm pattern could not be resolved.

In the case that the dissolution rate was more than 2.4 nm/second, such as those in Comparative Example 4, Comparative Example 5, and Comparative Example 6, the undercut formation was observed in the pattern with the collapse of the 40-nm pattern. When the film thickness was 90 nm, the undercut formation was not observed, but it can be seen that the undercut tends to be formed easily as the film thickness becomes thinner to 60 nm.

Examples 27 to 32

The negative resist composition of the present invention was prepared by mixing base resins, as the base resin of the negative resist composition, having different dissolution rates into the alkaline developer in accordance with the following Table 10 so that the dissolution rate of the resist film into the alkaline developer might become in the range of 1.0 nm/second or more and 2.4 nm/second or less; then the negative resist pattern was formed in the same way as Examples 21 to 26. Evaluation results of the resolution and the pattern profile of them, including the result of the dissolution rate of the resist into the alkaline developer, are shown in the following Table 11.

TABLE 11

|  | resolution (nm) | pattern's cross section profile | dissolution rate into the alkaline developer (nm/s) |
|---|---|---|---|
| Ex. 27 | 40 | Good | 2.4 |
| Ex. 28 | 40 | Good | 2.2 |
| Ex. 29 | 40 | Good | 2.2 |
| Ex. 30 | 40 | Good | 1.9 |
| Ex. 31 | 40 | Good | 2.0 |
| Ex. 32 | 40 | Good | 1.5 |

When the dissolution rate into the alkaline developer was adjusted so that the rate might become in the range of 1.0 nm/second or more and 2.4 nm/second or less, the 40-nm pattern could be obtained without undercut formation in any of the Examples.

Examples 33 to 39

The negative resist composition of the present invention was prepared by using, among the base resins to be used in the negative resin composition, a base resin having a rather small dissolution rate and PAG-2 (acid generator having a small anti-dissolution effect of the resist film) in accordance with the following Table 12 so that the dissolution rate of the resist film into the alkaline developer might become in the range of 2.0 nm/second or more and 4.4 nm/second or less; then the negative resist pattern was formed with the film thickness of 90 nm in the same way as Examples 1 to 6. Evaluation results of the resolution and the pattern profile of them, including the result of the dissolution rate of the resist film into the alkaline developer, are shown in the following Table 13.

TABLE 10

| composition (parts by mass) | Ex. 27 | Ex. 28 | Ex. 29 | Ex. 30 | Ex. 31 | Ex. 32 |
|---|---|---|---|---|---|---|
| polymer-1 | 40 | | | | | |
| polymer-2 | | 40 | | | | |
| polymer-3 | | | | | 40 | |
| polymer-4 | | | 40 | | | |
| polymer-5 | | | 40 | | 40 | |
| polymer-6 | | | | | | 40 |
| polymer-7 | | | | 40 | | |
| polymer-8 | | | | 40 | | 40 |
| polymer-9 | | | | | | |
| polymer-10 | 40 | 40 | | | | |
| PAG-1 | 10 | 10 | 10 | 10 | 10 | 10 |
| Quencher-1 | 0.1 | 0.1 | 0.1 | 0.1 | 0.1 | 0.1 |
| Quencher-3 | 0.1 | 0.1 | 0.1 | 0.1 | 0.1 | 0.1 |
| crosslinker | 8.2 | 8.2 | 8.2 | 8.2 | 8.2 | 8.2 |
| Surfactant A | 0.07 | 0.07 | 0.07 | 0.07 | 0.07 | 0.07 |
| solvent (A) | 800 | 800 | 800 | 800 | 800 | 800 |
| solvent (B) | 1600 | 1600 | 1600 | 1600 | 1600 | 1600 |
| solvent (C) | 2,000 | 2,000 | 2,000 | 2,000 | 2,000 | 2,000 |

TABLE 12

| composition (parts by mass) | Ex. 33 | Ex. 34 | Ex. 35 | Ex. 36 | Ex. 37 | Ex. 38 | Ex. 39 |
|---|---|---|---|---|---|---|---|
| polymer-3 | 80 | | | | | | |
| polymer-5 | | 80 | | | | | |
| polymer-6 | | | 80 | | | | |

TABLE 12-continued

| composition (parts by mass) | Ex. 33 | Ex. 34 | Ex. 35 | Ex. 36 | Ex. 37 | Ex. 38 | Ex. 39 |
|---|---|---|---|---|---|---|---|
| polymer-7 |  |  |  | 80 |  |  |  |
| polymer-8 |  |  |  |  | 80 |  |  |
| polymer-9 |  |  |  |  |  | 80 |  |
| polymer-10 |  |  |  |  |  |  | 80 |
| PAG-2 | 10 | 10 | 10 | 10 | 10 | 10 | 10 |
| Quencher-1 | 0.1 | 0.1 | 0.1 | 0.1 | 0.1 | 0.1 | 0.1 |
| Quencher-3 | 0.1 | 0.1 | 0.1 | 0.1 | 0.1 | 0.1 | 0.1 |
| crosslinker | 8.2 | 8.2 | 8.2 | 8.2 | 8.2 | 8.2 | 8.2 |
| surfactant A | 0.07 | 0.07 | 0.07 | 0.07 | 0.07 | 0.07 | 0.07 |
| solvent (A) | 800 | 800 | 800 | 800 | 800 | 800 | 800 |
| solvent (B) | 800 | 800 | 800 | 800 | 800 | 800 | 800 |
| solvent (C) | 1,000 | 1,000 | 1,000 | 1,000 | 1,000 | 1,000 | 1,000 |

TABLE 13

|  | resolution (nm) | pattern's cross section profile | dissolution rate into the alkaline developer (nm/s) |
|---|---|---|---|
| Ex. 33 | 50 | Good | 4.3 |
| Ex. 34 | 50 | Good | 3.6 |
| Ex. 35 | 50 | Good | 4.0 |
| Ex. 36 | 50 | Good | 4.4 |
| Ex. 37 | 50 | Good | 3.1 |
| Ex. 38 | 50 | Good | 2.5 |
| Ex. 39 | 50 | Good | 2.1 |

When the negative resist composition was prepared by selecting a base resin having a slow dissolution rate, the dissolution rate of the resist film into the alkaline developer could be controlled in the range of 2.0 nm/second or more and 4.4 nm/second or less without using PAG-1.

In any of the Examples, the 50-nm pattern could be formed without undercut formation.

The evaluation results of the resist pattern obtained from the foregoing Examples and Comparative Examples, in which the film thickness of the resist film is taken in the horizontal axis and the dissolution rate of the resist film into the alkaline developer is taken in the vertical axis, are shown in FIG. 1.

As can be seen in FIG. 1, in the case that the resist film is formed from the negative resist composition, when the pattern is formed by using the resist film whose dissolution rate into the alkaline developer is in the range of 0.0333X−1.0 (nm/second) or more and 0.0667X−1.6 (nm/second) or less, a resist pattern having a high resolution and a desirable form can be obtained without undercut formation or the like even when the pattern with the minimum line width of 50 nm or less is formed by using a thin resist film like the one having the film thickness of 50 to 100 nm.

From the foregoing results, it became clear that the resist pattern with a high resolution and a desirable form can be obtained with warranting that the undercut is difficult to be formed, when the pattern formation is done by using a resist film-forming composition that has passed the test; the testing process is to judge the composition to be acceptable when the dissolution rate of the resist film into the alkaline developer is in the range of 0.0333X−1.0 (nm/second) or more and 0.0667X−1.6 (nm/second) or less wherein the resist film having the film thickness X (nm) of 50 to 100 nm is formed and the dissolution rate of this resist film is measured by using the alkaline developer.

It also became clear that the resist pattern with a high resolution can be formed without undercut formation, when the negative resist composition is prepared by selecting each component (base resin, acid generator, basic component, and so on) so that the dissolution rate of the resist film having the film thickness X (nm) of 50 to 100 nm into the alkaline developer may be 0.0333X−1.0 (nm/second) or more and 0.0667X−1.6 (nm/second) or less, then this negative resist composition is applied to form the resist film having the film thickness of X (nm), and then the pattern exposure and development are done according to the prescribed process. It became also clear that control of the dissolution rate by means of selecting the kinds and the blending ratio of the base resins having different dissolution rates into the alkaline developer is a useful preparation process of the resist composition of the present invention, especially as in the cases of Examples 11 to 14 and Examples 27 to 32.

Here, it must be stressed that the present invention is not restricted to the foregoing embodiments. The foregoing embodiments are merely examples so that any embodiment composed of substantially the same technical concept as disclosed in the claims of the present invention and expressing a similar working effect is included in the technical scope of the present invention.

What is claimed is:

1. A resist patterning process, the resist patterning process by a lithography, comprising, at least,
    (a) forming a resist film having a film thickness of X(nm) of 50 to 100 nm on a substrate to be processed, said resist film being formed by using a negative resist composition comprising at least
    (A) a base resin that is alkaline-soluble and is made alkaline-insoluble by action of an acid, and/or a combination of a base resin that is alkaline-soluble and is made alkaline-insoluble by reaction with a crosslinker by action of an acid, with a crosslinker, wherein the base resin contains a phenolic hydroxyl group, wherein 95% or more by mol of the repeating units constituting the base resin include a monomer structure having an aromatic skeleton, the repeating units constituting the base resin include any combination of the repeating units represented by the following general formulae (1) to (3),

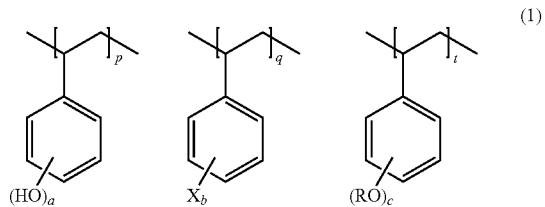

-continued (2)

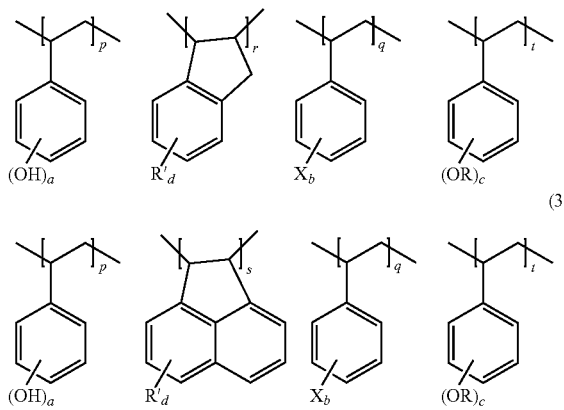

(3)

wherein X represents a chlorine atom, a bromine atom, an iodine atom, a nitro group, or a cyano group; R represents a linear, a branched, or a cyclic alkyl or oxoalkyl group having 2 to 10 carbon atoms, or a substituted or an unsubstituted benzoyl or naphthoyl group; R' represents a hydrogen atom, or a linear, a branched, or a cyclic alkyl or oxoalkyl group having 2 to 10 carbon atoms, or a substituted or an unsubstituted benzoyl or naphthoyl group; p, q, r, and s represent a positive integer; t represents 0 or a positive integer; a and b represent 1 or 2; c represents an integer of 0 to 3; and d represents 0 to 2, (B) an acid generator, and
(C) a compound containing a nitrogen as a basic component,
(b) exposing the resist film to a high energy beam to form an intended resist pattern, and
(c) developing the resist film by an alkaline developer to obtain a resist pattern, the dissolution rate of the resist film in the alkaline developer being controlled in the range of 0.0333X–1.0 (nm/second) or more and 0.0667X–1.6 (nm/second) or less by selecting each (A), (B) and (C) component.

2. The resist patterning process according to claim 1, wherein the acid generator of the component (B) contains at least one or more kinds of the compounds represented by the following general formula (4), (4)

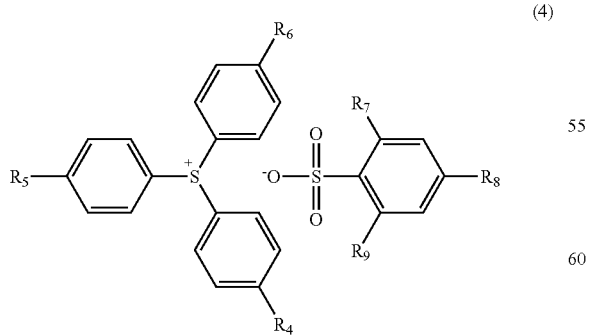

wherein $R_4$, $R_5$, and $R_6$ represent a hydrogen atom, or a linear, a branched, or a cyclic alkyl or alkyloxy group having 4 to 10 carbon atoms, wherein all of them cannot be a hydrogen atom; and $R_7$, $R_8$, and $R_9$ represent a hydrogen atom, a methyl group, an ethyl group, or an isopropyl group, wherein they may be the same or different.

3. The resist patterning process according to claim 1, wherein the basic component of the component (C) contains one or more kinds of amine compounds or amine oxide compounds having at least a carboxyl group and not having a hydrogen atom covalently bonded to a base-center nitrogen atom.

4. The resist patterning process according to claim 2, wherein the basic component of the component (C) contains one or more kinds of amine compounds or amine oxide compounds having at least a carboxyl group and not having a hydrogen atom covalently bonded to a base-center nitrogen atom.

5. The resist patterning process according to claim 3, wherein the amine compound or amine oxide compound having a carboxyl group and not having a hydrogen atom covalently bonded to a base-center nitrogen atom includes one or more kinds of the compounds represented by the following general formulae (5) to (7), (5)

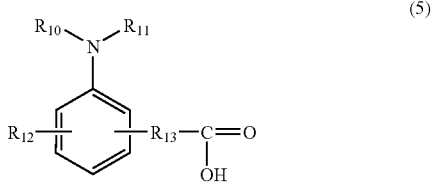

wherein $R_{10}$ and $R_{11}$ each represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; $R_{10}$ and $R_{11}$ may be bonded to form a cyclic structure; $R_{12}$ represents a hydrogen atom, or a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, an alkyl thioalkyl group having 1 to 10 carbon atoms, or a halogen group; $R_{13}$ represents a linear, a branched, or a cyclic alkylene group having 0 to 20 carbon atoms, or an arylene group having 6 to 20 carbon atoms;

(6)

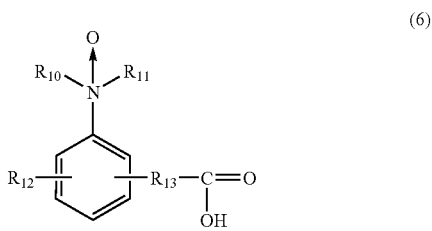

wherein $R_{10}$, $R_{11}$, $R_{12}$, and $R_{13}$ represent the same meaning as before;

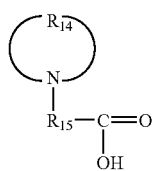
(7)

wherein $R_{14}$ represents a linear or a branched alkylene group, substituted or unsubstituted, having 2 to 20 carbon atoms which may contain one or a plurality of a carbonyl group, an ether group, an ester group, and a sulfide between the carbon-carbon bond of the alkylene group; and $R_{15}$ represents a linear, a branched, or a cyclic alkylene group having 1 to 20 carbon atoms, or an arylene group having 6 to 20 carbon atoms.

6. The resist patterning process according to claim 4, wherein the amine compound or amine oxide compound having a carboxyl group and not having a hydrogen atom covalently bonded to a base-center nitrogen atom includes one or more kinds of the compounds represented by the following general formulae (5) to (7),

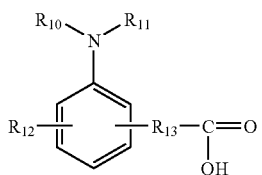
(5)

wherein $R_{10}$ and $R_{11}$ each represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; $R_{10}$ and $R_{11}$ may be bonded to form a cyclic structure; $R_{12}$ represents a hydrogen atom, or a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, an alkyl thioalkyl group having 1 to 10 carbon atoms, or a halogen group; $R_{13}$ represents a linear, a branched, or a cyclic alkylene group having 0 to 20 carbon atoms, or an arylene group having 6 to 20 carbon atoms;

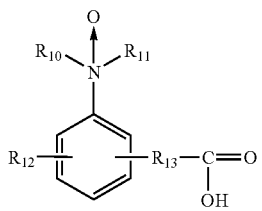
(6)

wherein $R_{10}$, $R_{11}$, $R_{12}$, and $R_{13}$ represent the same meaning as before;

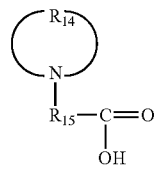
(7)

wherein $R_{14}$ represents a linear or a branched alkylene group, substituted or unsubstituted, having 2 to 20 carbon atoms which may contain one or a plurality of a carbonyl group, an ether group, an ester group, and a sulfide between the carbon-carbon bond of the alkylene group; and $R_{15}$ represents a linear, a branched, or a cyclic alkylene group having 1 to 20 carbon atoms, or an arylene group having 6 to 20 carbon atoms.

7. The resist patterning process according to claim 3, wherein the basic component of the component (C) further contains at least one or more kinds selected from amine compounds and amine oxide compounds represented by the following general formulae (8) and (9),

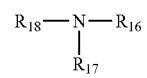
(8)

wherein $R_{16}$, $R_{17}$, and $R_{18}$ each represents a hydrogen atom, or a linear, a branched, or a cyclic alkyl group having 1 to 20 carbon atoms, an aryl group having 6 to 20 carbon atoms, an aralkyl group having 7 to 20 carbon atoms, a hydroxyl alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; two of $R_{16}$, $R_{17}$, and $R_{18}$ may be bonded to form a cyclic structure or an aromatic ring;

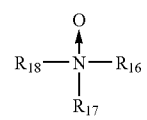
(9)

wherein $R_{16}$, $R_{17}$, and $R_{18}$ represent the same meaning as before.

8. The resist patterning process according to claim 1, wherein a photomask blank is used as the substrate to be processed.

9. The resist patterning process according to claim 8, wherein a chromium compound film is formed on the outermost surface of the photomask blank.

10. A negative resist composition for use in a resist patterning process, wherein the negative resist composition comprises (A) a base resin that is alkaline-soluble and is made alkaline-insoluble by action of an acid, and/or a combination of a base resin that is alkaline-soluble and is made alkaline-insoluble by reaction with a crosslinker by action of an acid, with a crosslinker, wherein the base resin contains a phenolic hydroxyl group, wherein 95% or more by mol of the repeating units constituting the base resin include a monomer structure having an aromatic skeleton, the repeating units constituting the base resin include any combination of the repeating units represented by the following general formulae (1) and (3),

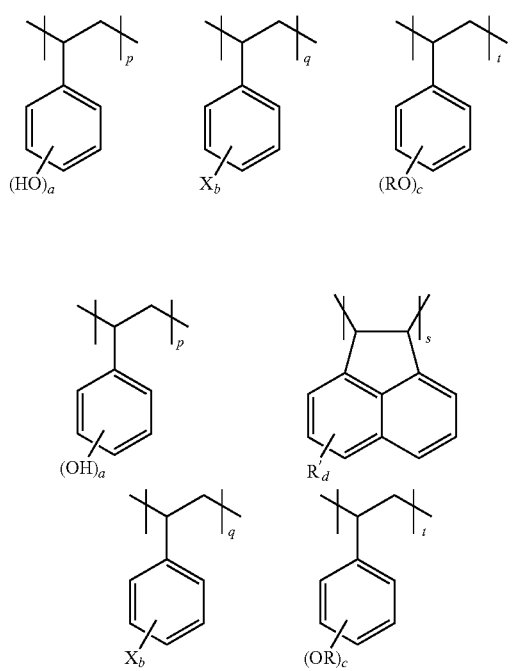

wherein X represents a chlorine atom, a bromine atom, an iodine atom, a nitro group, or a cyano group; R represents a linear, a branched, or a cyclic alkyl or oxoalkyl group having 2 to 10 carbon atoms, or a substituted or an unsubstituted benzoyl or naphthoyl group; R' represents a hydrogen atom, or a linear, a branched, or a cyclic alkyl or oxoalkyl group having 2 to 10 carbon atoms, or a substituted or an unsubstituted benzoyl or naphthoyl group; p, q, and s represent a positive integer; t represents an integer number of 1 or more; a and b represent 1 or 2; c represents an integer of 0 to 3; and d represents 0 to 2, (B) an acid generator, and (C) a compound containing a nitrogen as a basic component, and wherein each of (A), (B), and (C) are selected so that the dissolution rate of a resist film formed from the composition is 0.0333X−1.0 (nm/second) or more and 0.0667X−1.6 (nm/second) or less in an alkaline developer that is used to develop the resist film and when the resist film has a film thickness of X(nm) of 50 to 100 nm.

11. The negative resist composition according to claim 10, wherein the preparation of the negative resist composition is done by selecting the kinds and the mixing ratio of two or more of the base resins, the two or more base resins have different dissolution rates in the alkaline developer.

* * * * *